United States Patent
Terada et al.

(10) Patent No.: US 10,094,879 B2
(45) Date of Patent: Oct. 9, 2018

(54) POWER SUPPLY CONTROL SYSTEM, POWER SUPPLY CONTROL DEVICE AND METHOD

(71) Applicant: Hitachi Automotive Systems, Ltd., Hitachinaka-shi, Ibaraki (JP)

(72) Inventors: Takahide Terada, Tokyo (JP); Mutsumi Kikuchi, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 112 days.

(21) Appl. No.: 15/105,944

(22) PCT Filed: Jan. 20, 2014

(86) PCT No.: PCT/JP2014/050919
§ 371 (c)(1),
(2) Date: Jun. 17, 2016

(87) PCT Pub. No.: WO2015/107687
PCT Pub. Date: Jul. 23, 2015

(65) Prior Publication Data
US 2016/0327612 A1 Nov. 10, 2016

(51) Int. Cl.
*G01N 27/416* (2006.01)
*G01R 31/36* (2006.01)
(Continued)

(52) U.S. Cl.
CPC ..... *G01R 31/3606* (2013.01); *G01R 31/3658* (2013.01); *G01R 31/3689* (2013.01); *G08B 21/182* (2013.01); *H01M 10/48* (2013.01); *H02J 7/025* (2013.01); *H02J 50/10* (2016.02); *H02J 50/80* (2016.02); *H01M 2010/4278* (2013.01)

(58) Field of Classification Search
CPC ................ G01R 31/36; G01R 31/3606; G01R 31/3658; G01R 31/3689; G01R 31/31924;
(Continued)

(56) References Cited

U.S. PATENT DOCUMENTS

2010/0073003 A1* 3/2010 Sakurai ............... H01M 10/482
324/426
2010/0176202 A1* 7/2010 Teraoka ............. G06K 19/0701
235/492
(Continued)

FOREIGN PATENT DOCUMENTS

JP 2002-324687 A 11/2002
JP 2010-81716 A 4/2010
(Continued)

OTHER PUBLICATIONS

International Search Report (PCT/ISA/210) issued in PCT Application No. PCT/JP2014/050919 dated Apr. 15, 2014 with English translation (three pages).
(Continued)

*Primary Examiner* — Thang Le
(74) *Attorney, Agent, or Firm* — Crowell & Moring LLP

(57) ABSTRACT

To provide a system for controlling power supplies in a device including batteries 12, 13, and 14 by wireless signals with high reliability. The system includes the batteries 12, 13, 14, a power supply control device 1 supplied with power from the batteries 12, 13, and 14, and a controller 15 for making wireless communication with the power supply control device 1. The power supply control device 1 includes a startup unit 37 for receiving a wireless startup signal transmitted from the controller 15 and controlling power supplying from the batteries to the power supply control device, and a communication unit 10 for making wireless communication with the controller. While the startup unit 37 is receiving the wireless startup signal, wireless communication is made by the communication unit 10.

14 Claims, 22 Drawing Sheets

(51) Int. Cl.
*H01M 10/48* (2006.01)
*H02J 50/80* (2016.01)
*H02J 50/10* (2016.01)
*G08B 21/18* (2006.01)
*H02J 7/02* (2016.01)
*H01M 10/42* (2006.01)

(58) Field of Classification Search
CPC ........ G01R 31/31922; G01R 31/31937; G01R 31/2605; G01R 31/405; H02J 50/10; H02J 7/025; H02J 50/80; G08B 21/182
See application file for complete search history.

(56) References Cited

U.S. PATENT DOCUMENTS

2012/0315863 A1 12/2012 Hasegawa
2014/0312913 A1* 10/2014 Kikuchi .................. H02J 5/00
 324/426
2016/0264010 A1* 9/2016 Boyer .................. B60L 11/182

FOREIGN PATENT DOCUMENTS

JP  WO2015092846  * 12/2013
WO  WO 2013/051156 A1  4/2013

OTHER PUBLICATIONS

Japanese-language Wirtten Opinion (PCT/ISA/237) issued in PCT Application No. PCT/JP2014/050919 dated Apr. 15, 2014 (five pages).
Extended European Search Report issued in counterpart European Patent Application No. 14878518.1 dated Jul. 18, 2017 (Nine (9) pages).
International Preliminary Report on Patentability (PCT/IB/338 & PCT/IB/373) issued in PCT Application No. PCT/JP2014/050919 dated Aug. 4, 2016, including English translation of document C2 (Japanese-language Written Opinion (PCT/ISA/237)) previously filed on Jun. 17, 2016 (9 pages).

* cited by examiner

FIG. 1
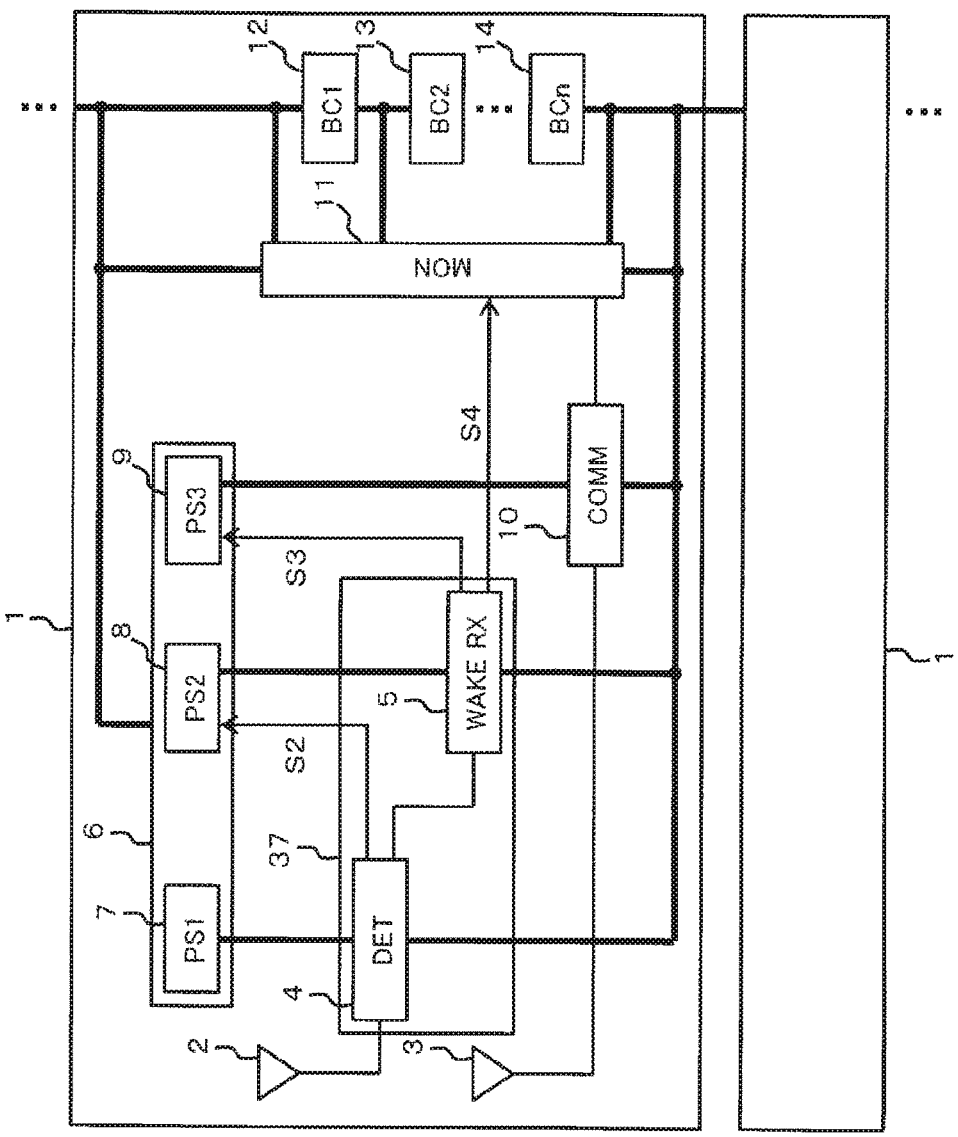
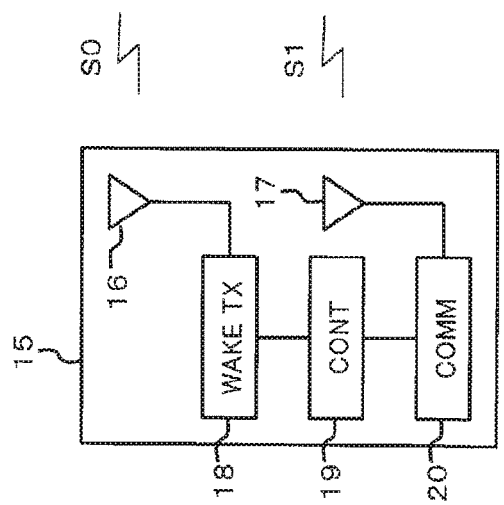

FIG. 16
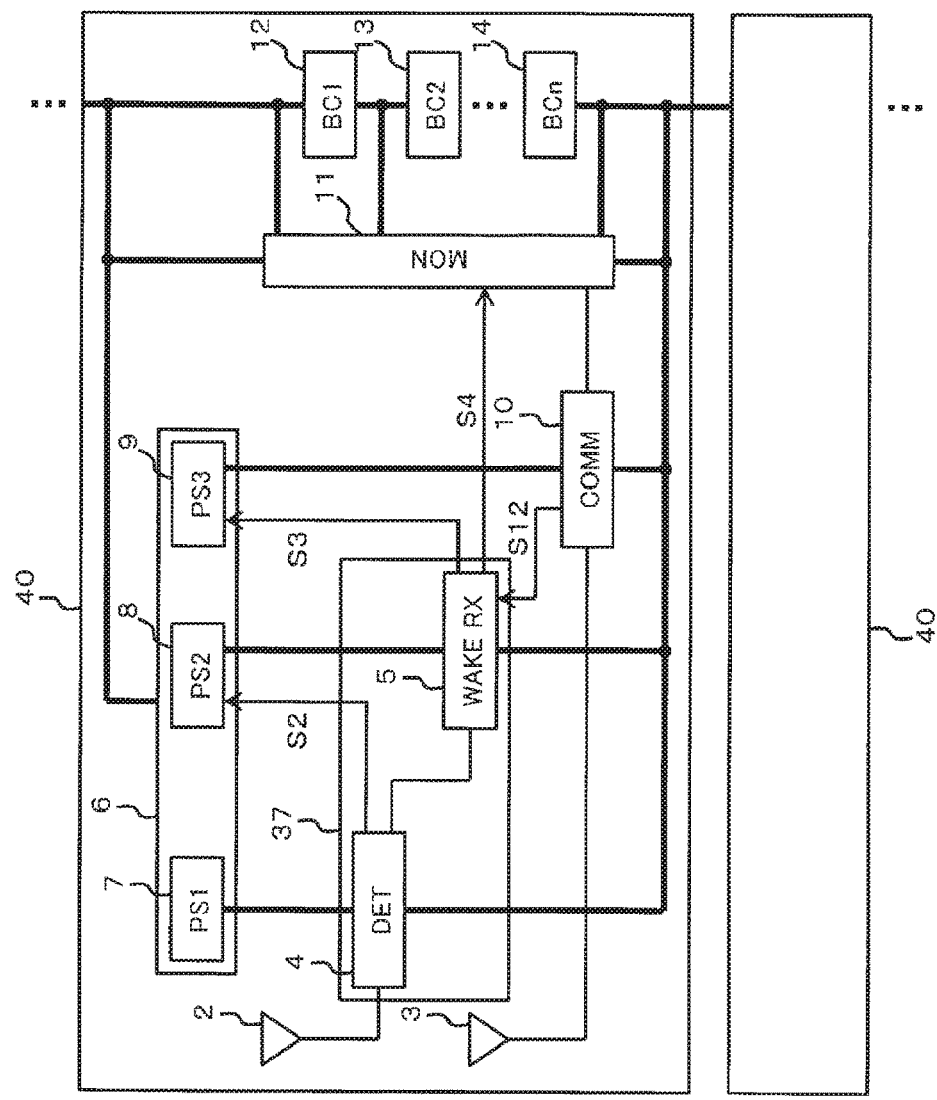
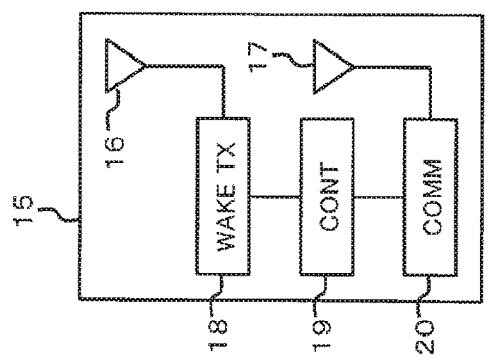

POWER SUPPLY CONTROL SYSTEM, POWER SUPPLY CONTROL DEVICE AND METHOD

TECHNICAL FIELD

The present invention relates to a power supply control system, a power supply control device and method, and particularly to a power supply control technique using wireless signals for a device including a battery or other power supply.

BACKGROUND ART

For example, PTL 1 discloses a battery monitoring device including a reception unit for receiving a wireless signal transmitted from a higher-order controller and outputting power and a demodulated signal based on the wireless signal, a decode circuit operating based on the power and directed for outputting a startup signal and a command based on the demodulated signal, a power supply circuit starting up based on the startup signal, and a transmission unit operating based on power supplied from the power supply circuit and directed for wirelessly transmitting a monitoring result.

CITATION LIST

Patent Literature

PTL 1: WO 2013/051156 A1

SUMMARY OF INVENTION

Technical Problem

In the battery monitoring device described in PTL 1, when a startup signal is not re-output from the decode circuit after the power supply circuit is started up until a predetermined timeout time elapses, the power supply circuit preferably stops operating. However, timings to receive wireless signals including a startup signal cannot be arbitrarily set irrespective of timings to receive wireless signals including battery monitoring commands and timings to transmit wireless signals of monitoring results, and thus when the operation is to be continued, the decode circuit cannot necessarily output a startup signal until the timeout time elapses. In particular, the operation is difficult to continue when a timing to wirelessly transmit a monitoring result or a wireless transmission time is changed depending on the contents of a command, or a plurality of battery monitoring devices are present.

An object of the invention is to provide a power supply control system, a power supply control device and method for controlling a power supply in a device including a battery or the like by wireless signals with high reliability.

Solution to Problem

According to a first solution of the present invention, there is provided a power supply control system including: one or more power supply control devices supplied with power from a battery; and a controller for wirelessly communicating signals with the power supply control devices, wherein each of the power supply control devices includes a startup unit for receiving a wireless startup signal transmitted from the controller, and supplying power from the battery to the communication unit while receiving the wireless startup signal, and a communication unit for, while being supplied with power from the battery, receiving a monitoring control instruction from the controller, acquiring a monitoring control result for the monitored and/or controlled battery, and transmitting the monitoring control result to the controller as needed in response to the monitoring control instruction.

According to a second solution of the present invention, there is provided a power supply control device including: a startup unit for receiving a wireless startup signal transmitted from a controller, and supplying power from the battery to the communication unit while receiving the wireless startup signal; and a communication unit for, while being supplied with power from the battery, receiving a monitoring control instruction from the controller, acquiring a monitoring control result for the monitored and/or controlled battery, and transmitting a monitoring control result to the controller as needed in response to the monitoring control instruction.

According a third solution of the present invention, there is provided a power supply control method in a power supply control system, wherein the power supply control system includes one or more power supply control devices supplied with power from a battery, and a controller for wirelessly communicating signals with the power supply control devices, wherein each of the power supply control devices receives a wireless startup signal transmitted from the controller, and supplies power from the battery to the communication unit while receiving the wireless startup signal, and while being supplied with power from the battery, receives a monitoring control instruction from the controller, acquires a monitoring control result for the monitored and/or controlled battery, and transmits a monitoring control result to the controller as needed in response to the monitoring control instruction.

Advantageous Effects of Invention

According to the invention, it is possible to control a power supply in a device including a battery or the like by wireless signals with high reliability.

BRIEF DESCRIPTION OF DRAWINGS

FIG. 1 is a block diagram illustrating an exemplary structure of a power supply control system according to a first exemplary embodiment.

FIG. 16 is a block diagram illustrating an exemplary structure of a power supply control system according to a forth exemplary embodiment.

DESCRIPTION OF EMBODIMENTS

Figure 2:
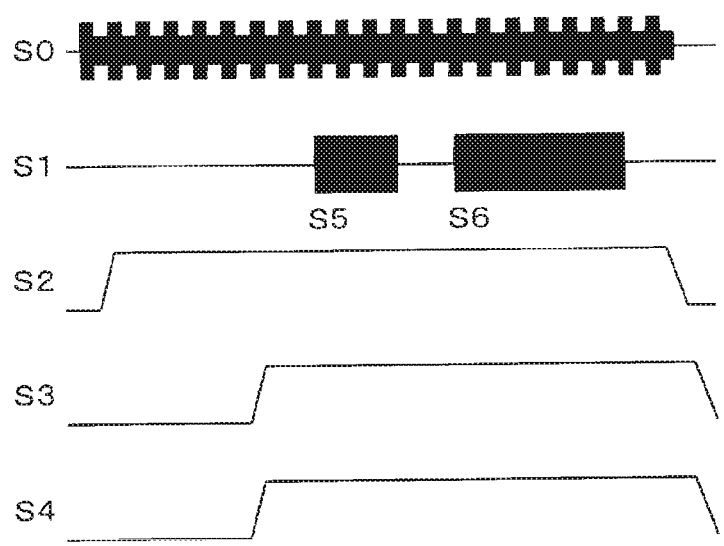
FIG. 2 illustrates exemplary signal waveforms for explaining an exemplary operation of a power supply control device.

Outlines of representative exemplary embodiments among the exemplary embodiments disclosed according to the present application will be briefly described as follows.

A power supply control system according to a representative exemplary embodiment includes a battery, a power supply control device supplied with power from the battery, and a controller for making wireless communication with the power supply control device, wherein the power supply control device includes a startup unit for receiving a wireless startup signal transmitted from the controller and controlling power supplying from the battery to the power supply control device, and a communication unit for making wireless communication with the controller, and while the startup unit is receiving the wireless startup signal, wireless communication is being made by the communication unit.

A power supply control device according to other representative exemplary embodiment includes a battery, a startup unit for receiving a wireless startup signal, and a communication unit for exchanging a wireless communication signal, wherein the startup unit controls power supplying from the battery to the communication unit depending on a reception result of the wireless startup signal, and while the startup unit is receiving the wireless startup signal, a wireless communication signal is being exchanged with the communication unit.

The battery may be provided outside the power supply control device.

First Exemplary Embodiment

A power supply control system for a device including battery cells will be described according to the present exemplary embodiment with reference to the drawings.

FIG. 1 is a block diagram of a power supply control system for a device including batteries. The power supply control system includes one or more power supply control devices 1 and a master controller 15. The master controller 15 controls the operations of the power supply control device 1 by use of a wireless startup signal s0, gives a monitoring control instruction for a battery cell 12 (BC1), a battery cell 13 (BC2), and a battery cell 14 (BCn) to the power supply control device 1 by use of a wireless communication signal s1, and collects monitoring control results. The number of battery cells is not limited to three, and may be any number of one or more. When a plurality of power supply control devices 1 are present, the battery cells provided therein may be connected in series or connected in parallel, or may not be connected with each other.

The master controller 15 includes an antenna 16 for transmitting the wireless startup signal s0, a startup signal transmission unit 18 for transmitting the wireless startup signal s0, an antenna 17 for exchanging the wireless communication signal s1, a communication unit 20 for exchanging the wireless communication signal s1, and a control unit 19 for controlling the startup signal transmission unit 18 and the communication unit 20. The master controller 15 is supplied with power from a higher-order system (not illustrated) to operate. Therefore, the operations of the master controller 15 are controlled by the higher-order system. The monitoring control results collected by the master controller 15 are transferred to the higher-order system (not illustrated) as they are, or processed into other information and transferred. The data may be transferred to the higher-order system via wired communication or wireless communication.

The power supply control device 1 includes an antenna 2 for receiving the wireless startup signal s0, a startup unit 37 for receiving the wireless startup signal s0, an antenna 3 for exchanging the wireless communication signal s1, and a communication unit 10 for exchanging the wireless communication signal s1. The power supply control device 1 further includes the battery cell 12, the battery cell 13, the battery cell 14, a battery cell monitoring control unit 11 for monitoring and controlling the battery cell 12, the battery cell 13, and the battery cell 14, and a power supply unit 6 for supplying power from the battery cells to a wireless signal detection unit 4, a startup signal determination unit 5, and the communication unit 10. The startup unit 37 includes the wireless signal detection unit 4 for detecting a signal intensity of a received wireless signal, demodulating the wireless signal, and outputting a baseband signal, and the startup signal determination unit 5 for determining a data pattern of the baseband signal output from the wireless signal detection unit 4.

The battery cell 12, the battery cell 13, and the battery cell 14 are secondary batteries such as lithium ion battery, sodium-sulfur battery, or zinc battery. When an excessive current is flowed for charging or discharging the secondary batteries, or when the secondary batteries are excessively charged or discharged, the property of the batteries is assumed to be deteriorated. Therefore, the master controller 15 needs to monitor the states of the battery cells, and to control them as needed. The battery cell 12, the battery cell 13, and the battery cell 14 may be provided outside the power supply control device 1.

The master controller 15 stops transmitting the wireless startup signal s0 or transmitting a monitoring control instruction via the wireless communication signal s1, changes a transmission cycle, or changes the contents of a monitoring control instruction depending on a monitoring control result of the power supply control device 1, thereby controlling the power supply control device 1 in a suitable state. When a satisfactory monitoring control result cannot be obtained such as when the wireless communication signal s1 transmitted from the power supply control device 1 cannot be received for a predetermined period of time or fails to be received at a certain rate, a connection switches (not illustrated) provided between the positive electrode of the battery cell 12 or the negative electrode of the battery cell 14 in the power supply control device 1 and other power supply control device 1 or other device may be separated and controlled such that each battery cell is not charged or discharged in the power supply control device 1.

The battery cell monitoring control unit 11 is supplied with power from the battery cell 12, the battery cell 13, and the battery cell 14 to operate. For example, the battery cell monitoring control unit 11 measures a voltage of each battery cell, discharges a battery cell with a high voltage for adjusting the voltages of the battery cells, or diagnoses the voltage measurement function or the discharge function of the battery cells in response to an instruction from the master controller 15. Therefore, the battery cell monitoring control unit 11 is electrically connected to the positive electrodes and the negative electrodes of the battery cell 12, the battery cell 13, and the battery cell 14, and an AD converter for measuring a voltage, a resistor for discharging, a reference voltage for diagnosis, and the like are provided at the connection parts.

The power supply unit 6 includes a power supply circuit 7 for supplying power to the wireless signal detection unit 4, a power supply circuit 8 for supplying power to the startup signal determination unit 5, and a power supply circuit 9 for supplying power to the communication unit 10. When the battery cell 12, the battery cell 13, and the battery cell 14 are connected in series, the positive voltage of the battery cell 12 is generally higher than the circuit operation voltage of the communication unit 10 or the like. It is therefore preferable that the power supply circuit 7, the power supply circuit 8, and the power supply circuit 9 are configured of a regulator for decreasing a voltage. For example, a linear regulator, a switching regulator, a DC/DC converter, or the like may be employed.

When receiving the wireless startup signal s0 transmitted from the master controller 15, the wireless signal detection unit 4 detects signal power of the wireless startup signal s0. When the detected signal power is higher than predetermined power, the wireless signal detection unit 4 outputs a power supply unit control signal s2 to operate the power supply circuit 8. The power supply circuit 8 operates and supplies power to the startup signal determination unit 5 only when input with the power supply unit control signal s2, and thus the startup signal determination unit 5 does not operate and consume power of the battery cells when the power supply unit control signal s2 is not output.

The wireless signal detection unit 4, which receives the wireless startup signal s0 higher than the predetermined power, outputs the power supply unit control signal s2, and outputs a baseband signal acquired by demodulating the wireless startup signal s0 to the startup signal determination unit 5. The wireless startup signal s0 is an amplitude-modulated signal and has a predetermined data pattern. When the power of the received wireless startup signal s0 is sufficiently high, the power wireless signal detection unit 4 may operate by not power supplied from the power supply circuit 7 but power of the wireless startup signal s0. Alternatively, the wireless signal detection unit 4 may operate by use of both power supplied from the power supply circuit 7 and power of the wireless startup signal s0. By doing so, the power consumed by the battery cells can be reduced while the wireless signal detection unit 4 is in reception standby for the wireless startup signal s0.

When the power supply circuit 8 operates and starts to supply power, the startup signal determination unit 5 starts to operate. The startup signal determination unit 5 processes the baseband signal output from the wireless signal detection unit 4, and recovers the data pattern of the wireless startup signal s0. The startup signal determination unit 5 determines whether the data pattern matches with a predetermined data pattern, and when they match with each other, outputs a power supply unit control signal s3 to operate the power supply circuit 9. The power supply circuit 9 operates and supplies power to the communication unit 10 only when input with the power supply unit control signal s3, and thus the communication unit 10 does not operate and consume power of the battery cells when the power supply unit control signal s3 is not output.

The startup signal determination unit 5, which is input with the baseband signal matching with a predetermined data pattern, outputs the power supply unit control signal s3, and outputs a battery cell monitoring control unit control signal s4 to the battery cell monitoring control unit 11. The battery cell monitoring control unit 11 operates only when input with the battery cell monitoring control unit control signal s4, and thus does not consume power of the battery cells when not receiving the wireless startup signal s0 and the startup signal determination unit 5 does not output the battery cell monitoring control unit control signal s4.

The predetermined data pattern may include the ID of the power supply control device 1 or includes the ID of a group made of a plurality of power supply control devices 1. By doing so, a specific or more power supply control devices 1 or a specific group of power supply control devices 1 can be started up, which can avoid starting up a power supply control device 1 which is not desired to start up. Additionally, instead of ID, the data pattern may be coded and the coding may be unique to each power supply control device 1 or to each group.

It is preferable that the startup signal determination unit 5 is reset and started up on being supplied with power from the power supply circuit 8 and a data pattern determination logic is initialized. For example, like the POWER ON RESET function generally mounted on a micro-control unit, the internal register is initialized to transit to a predetermined state when supplied with power. Alternatively, the power supply circuit 8 or the wireless signal detection unit 4 may output a reset signal to the startup signal determination unit 5.

When the power supply circuit 9 operates and starts to supply power, the communication unit 10 starts to operate. The communication unit 10 receives a wireless communication signal via the antenna 3, and receives a monitoring control instruction from the master controller 15. The communication unit 10 causes the battery cell monitoring control unit 11 to monitor and control each battery cell in response to the monitoring control instruction, and receives the results from the battery cell monitoring control unit 11. The communication unit 10 then transmits a wireless communication signal (monitoring control result) via the antenna 3, and transmits the monitoring control results of the battery cells received from the battery cell monitoring control unit 11 to the master controller 15. The communication unit 10 may record the received monitoring control results in a memory, collect them in a small number of wireless communication signals, and transmit them to the master controller 15.

Alternatively, when the monitoring control instruction is configured of a plurality of monitoring control commands, the communication unit 10 may record the monitoring control instruction in the memory, and individually transmit the monitoring control commands to the battery cell monitoring control unit 11. In this way, the communication unit 10 makes wireless communication with the master controller 15 and controls the battery cell monitoring control unit 11 so that it can be configured of a micro-control unit mounting the wireless communication function.

There may be configured such that the communication unit 10 is reset and started up on being supplied with power from the power supply circuit 9, and transits to a predetermined state. For example, like the POWER ON RESET function generally mounted on a micro-control unit, there is configured such that the internal register is initialized when supplied with power, and transits to a reception standby state. Alternatively, the power supply circuit 9 or the startup signal determination unit 5 may output a reset signal to the communication unit 10.

There may be configured such that the communication unit 10 outputs the battery cell monitoring control unit control signal s4 instead of the startup signal determination unit 5. By doing so, when the contents of the monitoring control instruction are only communication, only the communication unit 10 may operate and the battery cell monitoring control unit 11 can stop being operated.

The monitoring control instruction transmitted from the master controller 15 may include the ID of the power supply control device 1, or the ID of a group configured of a plurality of power supply control devices 1. By doing so, only a specific or more power supply control devices 1 or a specific group of power supply control devices 1 can monitor and control. Thereby, the power supply control devices 1, which do not need to be monitored and controlled, monitor and control, thereby reducing unnecessary power consumption or communication. A data pattern may be coded instead of the ID, and the coding may be unique to each power supply control device 1 or each group. The coding enables interferences in the wireless communication signals to be reduced even when the power supply control devices 1 and the master controller 15 make communication at the same time.

The wireless communication signal s1 for monitoring control instruction is regularly transmitted from the master controller 15 or irregularly transmitted when a specific condition is met. Accordingly, the power supply control device 1 regularly monitors and controls, or irregularly monitors and controls. The monitoring control instruction transmitted from the master controller 15 does not necessarily include an instruction of transmitting a monitoring control result to the master controller 15. The monitoring control results may be recorded in the memory in the communication unit 10 or the battery cell monitoring control unit 11, and the monitoring control results may be transmitted at a time for a plurality of monitoring control instructions. By doing so, the power supply control device 1 can reduce the number of times of transmission of the wireless communication signal s1, thereby reduce power consumption. When a plurality of power supply control devices 1 are present, it is possible to easily avoid the wireless communication signals s1 from mutually colliding. As described above, the transmission timings of the wireless communication signal s1 and the monitoring control contents can be flexibly changed depending on an installation environment or use situation of the power supply control devices 1.

The wireless communication signal s1 for monitoring control result is regularly transmitted from the power supply control device 1 or irregularly transmitted when a specific condition is met. Further, when a plurality of power supply control devices 1 are present, the wireless communication signal s1 is transmitted at timings previously determined by the ID, transmitted at timings instructed by the monitoring control instruction, or transmitted after a confirmation is made as to whether other power supply control device 1 transmits before the transmission in order to avoid the transmission signals from mutually colliding.

When the frequencies of the wireless startup signal s0 and the wireless communication signal s1 are close, it is preferable that the antenna 2 is installed in the null point direction of the antenna 3. Alternatively, it is preferable that a radio wave propagation loss from the antenna 3 to the antenna 2 is increased by installing a conductive plate between the antenna 2 and the antenna 3, for example. When the wireless communication signal s1 transmitted from the antenna 3 is received by the antenna 2 installed at a short distance, it interferes with the wireless startup signal s0 and the data pattern of the wireless startup signal s0 can be erroneously determined. In order to reduce the possibility, the antenna 2 is installed in a direction in which the wireless communication signal s1 transmitted from the antenna 3 is largely deteriorated and propagated.

When the frequencies of the wireless startup signal s0 and the wireless communication signal s1 are close, it is preferable that an antenna 17 is installed in the null point direction of an antenna 16. Alternatively, it is preferable that a radio wave propagation loss from the antenna 16 to the antenna 17 is increased by installing a conductive plate between the antenna 17 and the antenna 16, for example. When the wireless startup signal s0 transmitted from the antenna 16 is received by the antenna 17 installed at a short distance, it interferes with the wireless communication signal s1 and the wireless communication signal s1 can fail to be received. In order to reduce the possibility, the antenna 17 is installed in a direction in which the wireless startup signal s0 transmitted from the antenna 16 is largely deteriorated and propagated.

FIG. 2 illustrates exemplary signal waveforms for explaining an exemplary operation of the power supply control device 1. FIG. 2 illustrates the wireless startup signal s0, the wireless communication signal s1, the power supply unit control signal s2, the power supply unit control signal s3, and the battery cell monitoring control unit control signal s4 in time series. The wireless startup signal s0 is such that a predetermined data pattern is modulated in amplitude, for example. The wireless communication signal s1 includes a monitoring control instruction signal s5 and a monitoring control result signal s6, and is modulated in frequency, for example. It is preferable that the power supply unit control signal s2, the power supply unit control signal s3, and the battery cell monitoring control unit control signal s4 are all digital signals.

It is preferable that different modulation systems, frequencies, codes, and the like are employed such that the wireless startup signal s0 and the wireless communication signal s1 can be exchanged at the same time. Further, it is preferable that limitations on data pattern, signal length, signal interval and the like of monitoring control instruction and monitoring control result are provided such that the wireless communication signal s1 is not taken for the wireless startup signal s0 and the signal waveform of the wireless communication signal s1 is not determined as the same data pattern as the wireless startup signal s0. It is preferable that transmission power of the wireless communication signal s1 is sufficiently lower than that of the wireless startup signal s0 in order to reduce the possibility that the wireless signal detection unit 4 detects the wireless communication signal s1 to operate the startup signal determination unit 5.

It is preferable that the modulation systems to be used, the frequencies, the codes, and the like are changed between the wireless startup signal s0 and the wireless communication signal s1 in order to reduce the possibility that reception power is reduced or the data pattern is mistaken due to a radio wave propagation environment between the master controller 15 and the power supply control device 1, such as influence of fading or interfering wave. The changes are made by instructing the power supply control device 1 from the master controller 15 via the wireless startup signal s0 or the wireless communication signal s1 or according to a predefined sequence.

It is preferable that when the power supply unit control signal s2, the power supply unit control signal s3, and the battery cell monitoring control unit control signal s4 are at Low level, for example, their target is stopped, and when they are at High level, their target is operated. By doing so, the startup signal determination unit 5 or the communication unit 10, which is not supplied with power from the power supply unit 6, does not output a High-level signal, thereby preventing the startup signal determination unit 5, the communication unit 10, and the battery cell monitoring control unit 11 from erroneously operating while the wireless startup signal s0 is not received.

When the wireless startup signal s0 is received by the power supply control device 1, the wireless signal detection unit 4 detects the wireless startup signal s0 and outputs the High-level power supply unit control signal s2. The High-level power supply unit control signal s2 is output so that the startup signal determination unit 5 starts to operate. The startup signal determination unit 5 determines the data pattern of the wireless startup signal s0, and outputs the High-level power supply unit control signal s3 and the High-level battery cell monitoring control unit control signal s4. The High-level power supply unit control signal s3 and the High-level battery cell monitoring control unit control signal s4 are output so that the communication unit 10 and the battery cell monitoring control unit 11 start to operate. Thereafter, the communication unit 10 receives the monitoring control instruction signal s5, and the battery cell monitoring control unit 11 performs predetermined monitoring control. The communication unit 10 then transmits the monitoring control result signal s6.

When monitoring control is terminated, the master controller 15 stops transmitting the wireless startup signal s0. When the wireless startup signal s0 is not received by the power supply control device 1, the startup signal determination unit 5 cannot determine the data pattern of the wireless startup signal s0, and stops outputting the High-level power supply unit control signal s3 and the High-level monitoring control unit control signal s4 to be at Low level. Thereby, the communication unit 10 and the battery cell monitoring control unit 11 stop operating. Further, the wireless signal detection unit 4 cannot detect the wireless startup signal s0, and stops outputting the High-level power supply unit control signal s2 to be at Low level. Thereby, the startup signal determination unit 5 stops operating. In this way, when the wireless startup signal s0 stops being transmitted, the startup signal determination unit 5, the communication unit 10, and the battery cell monitoring control unit 11 in the power supply control device 1 stop operating.

When a plurality of power supply control devices 1 are present, the wireless startup signal s0 may be common in all the power supply control devices 1, or common in some of the power supply control devices 1, or individual for each power supply control device 1. When the wireless startup signal s0 is common in all the power supply control devices 1, all the power supply control devices 1 can be started up by one wireless startup signal s0. At this time, the startup determination units 5 provided in all the power supply control devices 1 have a common predetermined data pattern. When the wireless startup signal s0 is common in some of the power supply control devices 1, each group of some power supply control devices 1 can be selectively started up depending on application, installation environment, use environment or the like. At this time, the startup determination units 5 provided in all the power supply control devices 1 have a predetermined data pattern common in individual group. Further, the wireless startup signal s0 is individual for each power supply control device 1, the power supply control devices 1 can be selectively started up one by one. At this time, the startup determination units 5 provided in all the power supply control devices 1 have individual predetermined data patterns, respectively. Only one predetermined data pattern may be provided, but the three patterns enable situation-dependent startup.

When a plurality of power supply control devices 1 are present, like the wireless startup signal s0, the monitoring control instruction signal s5 may be common in all the power supply control devices 1, common in some of the power supply control devices 1, or individual for each power supply control device 1. In wireless communication, the ID of a communication party may be included in a signal to be transmitted in order to specify the communication party. The ID included in the monitoring control instruction signal s5 is assumed as the common ID in all the power supply control devices 1, as the common ID in some of the power supply control devices 1, or as an individual ID for each power supply control device 1, thereby variously specifying the power supply control devices 1 as communication party.

When a plurality of power supply control devices 1 are present, the monitoring control result signal s6 may be transmitted by use of a typical multi-access technique such as TDMA or CSMA/CA. The monitoring control result signal s6 is received by the same master controller 15, and thus the signals are controlled not to mutually collide.

It is preferable that when detected signal power is higher than predetermined power for a predetermined period of time, the wireless signal detection unit 4 outputs the High-level power supply unit control signal s2. By doing so, even if a high-power noise is instantaneously caused from an inverter or the like, it is not erroneously detected.

Further, it is preferable that when detected signal power is lower than predetermined power for a predetermined period of time, the High-level power supply unit control signal s2 stops being output to be at Low level. By doing so, even if the reception power of the wireless startup signal s0 instantaneously lowers unintentionally, the startup determination unit 5 can continue to operate. Alternatively, even when the power of the master controller 15 lowers at transmission intervals of the wireless startup signal s0 by the master controller 15, the startup determination unit 5 can continue to operate.

When a predetermined period of time set for the wireless signal detection unit 4 may be previously determined, or may be changed depending on a situation of the power supply control device 1, or may be set by instructing the power supply control device 1 from the master controller 15 via the wireless startup signal s0 or the wireless communication signal s1. A situation of the power supply control device 1 is a difference in situation during driving, storage, and maintenance of the power supply control device 1, a difference in radio wave propagation environment between the master controller 15 and the power supply control device 1, a difference in number of power supply control devices 1 to be monitored and controlled, or the like. It is preferable that a setting signal is output from the startup signal determination unit 5 or the communication unit 10 to the wireless signal detection unit 4 to be held in the wireless signal detection unit 4 for a predetermined period of time.

When it is determined that the baseband signal input from the wireless signal detection unit 4 matches with a predetermined data pattern for a predetermined period of time, it is preferable that the startup signal determination unit 5 outputs the High-level power supply unit control signal s3 and the High-level battery cell monitoring control unit control signal s4. Alternatively, when it is determined that the data pattern of the wireless startup signal s0 matches with a predetermined data pattern more than predetermined times, it is preferable that the startup signal determination unit 5 outputs the High-level power supply unit control signal s3 and the High-level battery cell monitoring control unit control signal s4. By doing so, a noise cannot be erroneously detected.

When it is determined that the data pattern of the wireless startup signal s0 does not match with a predetermined data pattern for a predetermined period of time, it is preferable that the startup signal determination unit 5 stops outputting the High-level power supply unit control signal s3 and the High-level battery cell monitoring control unit control signal s4 to be at Low level. Alternatively, when it is determined that the data pattern of the wireless startup signal s0 does not match with a predetermined data pattern more than predetermined times, it is preferable that the startup signal determination unit 5 stops outputting the High-level power supply unit control signal s3 and the High-level battery cell monitoring control unit control signal s4 to be at Low level. By doing so, even when the reception power of the wireless startup signal s0 instantaneously lowers unintentionally or the data pattern is mistaken due to noise, the communication unit 10 and the battery cell monitoring control unit 11 can continue to operate. Alternatively, even when the power of the master controller 15 lowers at transmission intervals of the wireless startup signal s0 by the master controller 15, the communication unit 10 and the battery cell monitoring control unit 11 can continue to operate.

The predetermined period of time or the predetermined number of times set for the startup signal determination unit 5 may be previously determined, or may be changed depending on a situation of the power supply control device 1, or may be set by instructing the power supply control device 1 from the master controller 15 via the wireless startup signal s0 or the wireless communication signal s1. A situation of the power supply control device 1 is a difference in situation during driving, storage and maintenance of the power supply control device 1, a difference in radio wave propagation environment between the master controller 15 and the power supply control device 1, a difference in number of power supply control devices 1 to be monitored and controlled, or the like. It is preferable that a setting signal is output from the communication unit 10 to the startup signal determination unit 5 to be held in the startup signal determination unit 5 for a predetermined period of time or the predetermined number of times. Alternatively, it is preferable that the startup signal determination unit 5 detects the setting based on the data pattern included in the wireless startup signal s0 and holds it therein.

Figure 3:
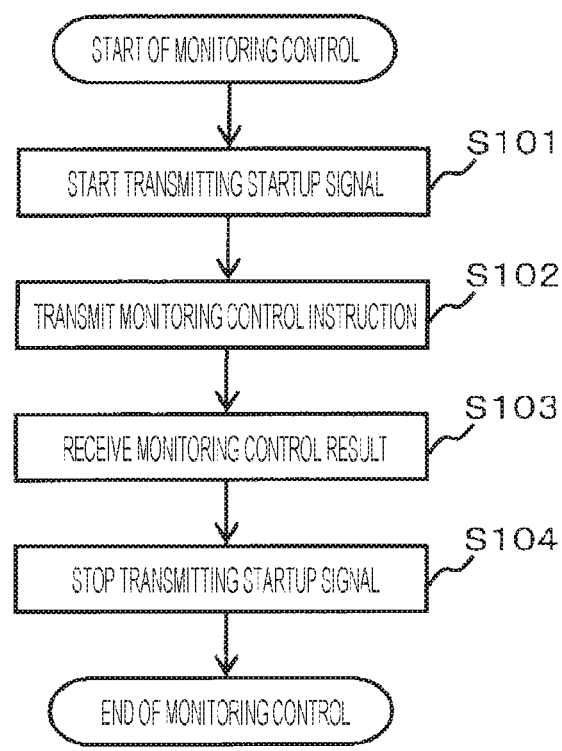
FIG. 3 is a flowchart for explaining an exemplary operation of a master controller.

FIG. 3 is a flowchart for explaining an exemplary operation of the master controller 15. The master controller 15 starts predetermined monitoring control in response to an instruction from a higher-order system, or depending on a situation of the power supply control device 1 or a situation of the master controller 15. At first, the master controller 15 starts to transmit the wireless startup signal (S101). After a time elapses in which the communication unit 10 in the power supply control device 1 is expected to start to operate, the master controller 15 transmits a monitoring control instruction to the power supply control device 1 (step S102). The master controller 15 then receives a monitoring control result from the power supply control device 1 which performs monitoring control on the battery cells (S103). The master controller 15, which receives the monitoring control result and completes the predetermined monitoring control, stops transmitting the startup signal (S104). The monitoring control is terminated in this way.

The monitoring control instruction transmission S102 and the monitoring control result reception S103 may be performed several times, and when the power supply control device 1 can grasp the monitoring control contents and can perform monitoring control on the battery cells, the monitoring control instruction transmission S102 may be omitted. Further, the monitoring control result reception S103 may not be necessarily performed, and the power supply control device 1 may only store the monitoring control result in the memory in the communication unit 10.

The start and end of monitoring control may be determined by the master controller 15 when a predetermined condition is met, or the monitoring control may be started or terminated when a signal is input from another system (not illustrated) into the control unit 19. A predetermined condition is that a predetermined period of time elapses or that a predetermined monitoring control result is obtained, for example.

Figure 4:
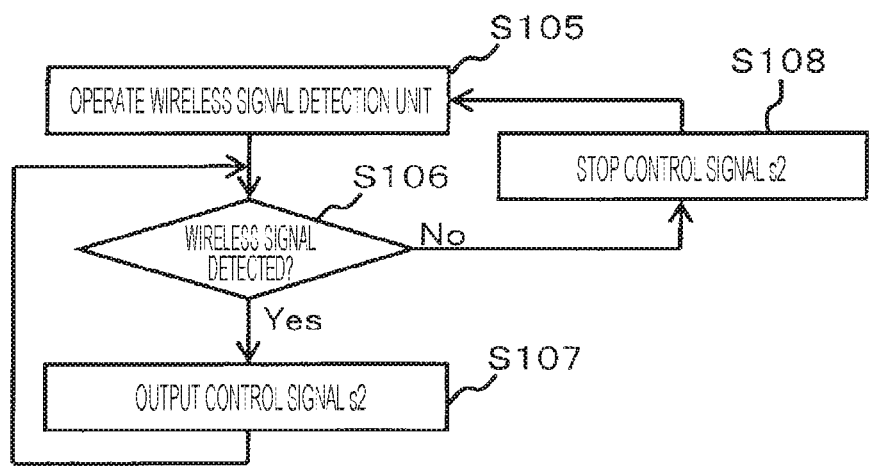
FIG. 4 is a flowchart for explaining an exemplary operation of a wireless signal detection unit.

FIG. 4 is a flowchart for explaining an exemplary operation of the wireless signal detection unit 4. The wireless signal detection unit 4 is always operating such that it can detect the wireless startup signal s0 any time (S105). At first, the wireless signal detection unit 4 detects whether a wireless signal is received at predetermined signal power or more (S106). When the wireless signal is detected, the wireless signal is likely to be the wireless startup signal s0, and thus the startup signal determination unit 5 needs to determine whether the wireless signal is the wireless startup signal s0. Thus, the wireless signal detection unit 4 outputs the power supply unit control signal s2 at High level (S107). The wireless signal detection unit 4 outputs the power supply unit control signal s2, and performs the wireless signal detection S106 again. When a wireless signal is not detected in the wireless signal detection S106, the wireless signal detection unit 4 sets the power supply unit control signal s2 at Low level (S108). The wireless signal detection unit 4 sets the power supply unit control signal s2 at Low level, and returns to the wireless signal detection unit operation S105 again to proceed to the wireless signal detection S106. In this way, the wireless signal detection unit 4 continues to detect the presence of a wireless signal, and changes the power supply unit control signal s2 to High level or Low level depending on the result.

When a wireless signal is received whose signal power is near a threshold in the wireless signal detection S106, or when a radio wave propagation environment is changed, the result of the wireless signal detection S106 can frequently change and the operation state of the power supply circuit 8 can frequently change. Thus, it is preferable that power of a wireless signal is leveled by a predetermined period of time, or the wireless signal detection S106 is performed at predetermined time intervals, or the result of the wireless signal detection S106 is held for a predetermined period of time. For example, the time constants of input and output of a circuit for detecting wireless signal power are set to be low, or a change in signal power of an input wireless signal or in detection result signal is made gentle. The time constants may be fixed values, or may be changed depending on a situation of the power supply control device 1. It is preferable that the time constants are set in response to an instruction from the master controller 15 while the startup signal determination unit 5 or the communication unit 10 is operating.

Figure 5:
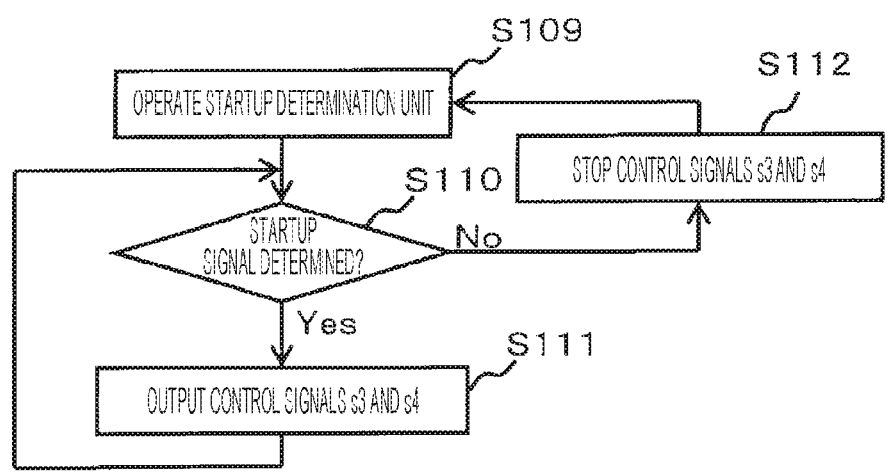
FIG. 5 is a flowchart for explaining an exemplary operation of a startup signal determination unit.

FIG. 5 is a flowchart for explaining an exemplary operation of the startup signal determination unit 5. The startup signal determination unit 5 is operating while supplied with power from the power supply circuit 8 (S109). At first, the startup signal determination unit 5 determines whether the data pattern of a wireless signal detected by the wireless signal detection unit 4 matches with a predetermined data pattern (S110). When the data patterns match with each other, the wireless signal is the startup signal. Thus, the startup signal determination unit 5 outputs the power supply unit control signal s3 and the battery cell monitoring control unit control signal s4 at High level in order to start up the communication unit 10 and the battery cell monitoring control unit 11 (S111). The startup signal determination unit 5 outputs the power supply unit control signal s3 and the battery cell monitoring control unit control signal s4, and makes the startup signal determination S110 again. When the data patterns do not match with each other in the startup signal determination S110, the startup signal determination unit 5 sets the power supply unit control signal s3 and the battery cell monitoring control unit control signal s4 at Low level (S112). The startup signal determination unit 5 sets the power supply unit control signal s3 and the battery cell monitoring control unit control signal s4 at Low level, and returns to the startup determination unit operation S109 again to proceed to the startup signal determination S110. In this way, while supplied with power, the startup signal determination unit 5 continues to determine whether the data pattern of a wireless signal detected by the wireless signal detection unit 4 matches with a predetermined data pattern, and changes the power supply unit control signal s3 and the battery cell monitoring control unit control signal s4 to High level or Low level depending on the result.

When signal power of the wireless startup signal is lower or an interfering wave is present, the result of the startup signal determination S110 can frequently change or the operation state of the power supply circuit 9 or the battery cell monitoring control unit 11 can frequently change. Thus, it is preferable that the result of the startup signal determination S110 is not determined by one determination result but is determined by determination results for a predetermined period of time or a predetermined number of times. For example, when the data patterns continuously match with each other for a predetermined period of time or a predetermined number of times, it is determined that the data patterns match with each other, when the data patterns do not continuously match with each other, it is determined that the data pattern do not match with each other, or when the data patterns match with each other at a predetermined rate, it is determined that the data patterns match with each other. The determination threshold may be a fixed value, or may be changed depending on a situation of the power supply control device 1. It is preferable that the determination threshold is set in response to an instruction from the master controller 15 while the startup signal determination unit 5 or the communication unit 10 is operating.

Figure 6:
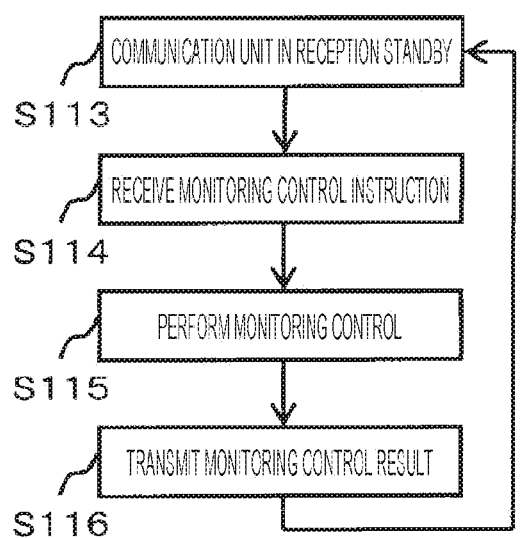
FIG. 6 is a flowchart for explaining an exemplary operation of a communication unit.

FIG. 6 is a flowchart for explaining an exemplary operation of the communication unit 10. The communication unit 10 is operating while supplied with power from the power supply circuit 9. At first, the communication unit 10 transits to the reception standby state in order to receive a monitoring control instruction from the master controller 15 (S113). The communication unit 10 then receives a monitoring control instruction transmitted from the master controller 15 (S114). After receiving the monitoring control instruction, the communication unit 10 causes the battery cell monitoring control unit 11 to perform monitoring control on the battery cells in response to the instruction (S115), and transmits the result to the master controller 15 (116). Thereafter, the communication unit 10 returns to the reception standby S113 again to wait for a next monitoring control instruction. In this way, the communication unit 10 receives a monitoring control instruction from the master controller 15, performs monitoring control, and transmits a monitoring control result while supplied with power. Further, the monitoring control instruction received in the monitoring control instruction reception S114 may be recorded in the memory and the monitoring control S115 may be performed in response to the recorded instruction. Further, the result of the monitoring control S115 may be recorded in the memory, and the monitoring control result may be transmitted (S116) at a predetermined timing or at a timing instructed by the monitoring control instruction.

Figure 7:
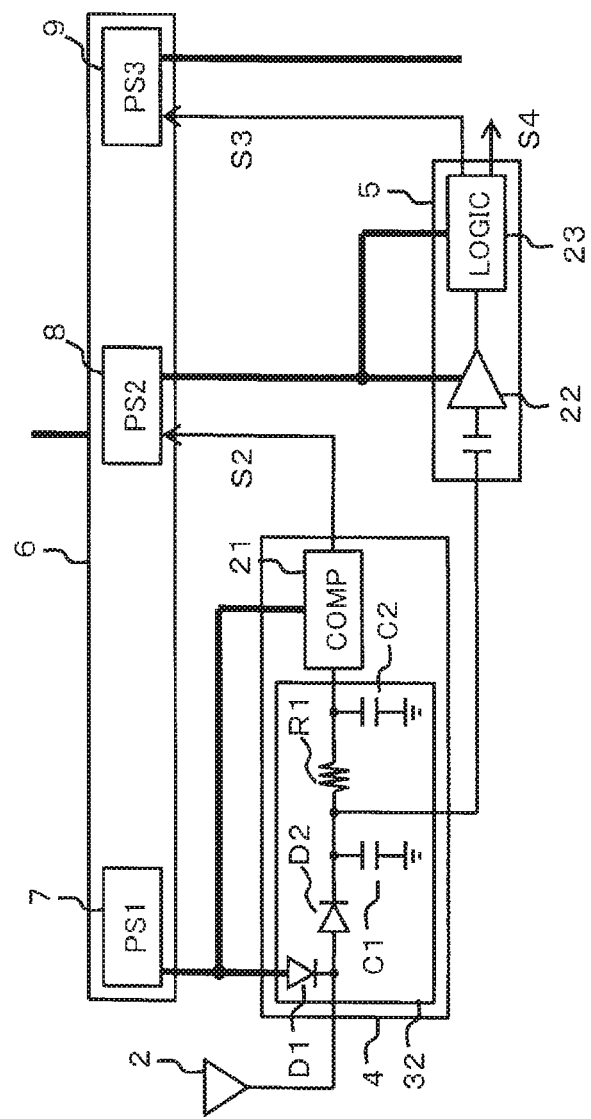
FIG. 7 is a circuit diagram illustrating an exemplary circuit structure of the wireless signal detection unit and the startup signal determination unit.

FIG. 7 is a circuit diagram illustrating an exemplary circuit structure of the wireless signal detection unit 4 and the startup signal determination unit 5. The wireless signal detection unit 4 includes a rectification circuit 32 and a comparator 21. The rectification circuit 32 has diodes D1, D2, capacitors C1, C2, and a resistor R1. The wireless startup signal s0 is rectified by the diodes D1 and D2, and charges are accumulated in the capacitors C1 and C2. There is configured such that the capacitor C1 is lower than the capacitor C2, a carrier wave component in the wireless startup signal s0 is rectified at the terminal of the capacitor C1 with connection via the resistor R1, and some baseband component having a remarkably lower frequency component than the carrier wave component remains. Then, all the components including the baseband component are rectified at the terminal of the capacitor C2 so that a DC voltage is generated depending on signal power of the wireless startup signal s0. By doing so, the signal power of the wireless startup signal s0 and the baseband signal are obtained. The baseband signal is output to the startup signal determination unit 5.

The DC voltage depending on the signal power of the wireless startup signal s0, which is generated at the terminal of the capacitor C2, is compared with a predetermined threshold voltage by the comparator 21. When the DC voltage is higher than the threshold voltage or when the signal power of the wireless startup signal s0 is higher than predetermined power, the comparator 21 outputs the High-level power supply unit control signal s2, and when the DC voltage is lower than the threshold voltage or when the signal power of the wireless startup signal s0 is lower than the predetermined power, the comparator 21 outputs the Low-level power supply unit control signal s2.

Since when the DC voltage is close to the threshold voltage, the output of the comparator 21 is frequently inverted due to noise, it is preferable that the threshold of the comparator 21 has the hysteresis property. Further, the resistor R1 and the capacitor C2 are sufficiently increased to level the influences of noises, thereby reducing the possibility that the output of the comparator 21 is frequently inverted. The hysteresis property, or the resistor R1 and the capacitor C2 may be changed by switch-connected devices arranged in an array shape.

The power supply circuit 7 supplies the comparator 21 with power, and applies a bias voltage to the diode D1. By doing so, a detection sensitivity of the wireless startup signal s0 can be increased. When power consumption of the wireless signal detection unit 4 is desired to decrease, it is preferable that the power supply voltage of the comparator 21 is assumed at the DC voltage generated at the terminal of the capacitor C2 or the bias voltage stops being applied to the diode D1.

The startup signal determination unit 5 includes an amplifier 22 and a logic circuit 23. The baseband signal output from the rectification circuit 32 is amplified by the amplifier 22 up to a signal level to be processed in the logic circuit 23. The logic circuit 23 previously records a predetermined data pattern, and makes determinations depending on whether the data pattern is matched or not. A plurality of data patterns may be recorded, and a determination may be made as to which of them a data pattern matches with. For example, in addition to the ID of the power supply control device, the ID of a group including the power supply control device, or the ID depending on a monitoring control priority may be employed.

The baseband signal changes in amplitude due to the signal power of the wireless startup signal s0. Thus, the amplifier 22 may have a variable amplification rate. Further, for fear that the data pattern of the baseband signal is erroneously determined, the logic circuit 23 may determine the levels of the power supply unit control signal s3 and the battery cell monitoring control unit control signal s4 by several determinations of the data pattern.

Figure 8:
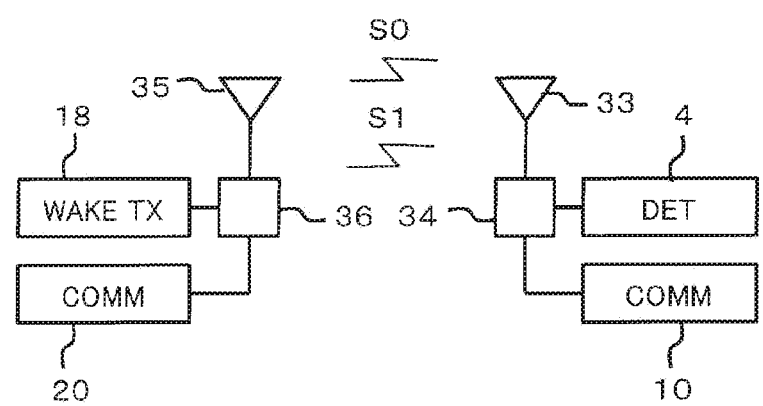
FIG. 8 is a block diagram illustrating an exemplary structure of a master controller, antennas of the power supply control device, and its peripheral parts.

FIG. 8 is a block diagram illustrating an exemplary structure of the master controller 15, antennas of the power supply control device 1, and its peripheral parts. The wireless signal detection unit 4 and the communication unit 10 are connected to an antenna 33 via a signal separation unit 34. The startup signal transmission unit 18 and the communication unit 20 are connected to an antenna 35 via a signal separation unit 36. The antenna 33 and the antenna 35 can exchange the wireless startup signal s0 and the wireless communication signal s1. When the frequencies of the wireless startup signal s0 and the wireless communication signal s1 are different, the antenna 33 and the antenna 35 are excellent in propagation property at the frequencies.

The signal separation unit 34 has a function of passing the wireless startup signal s0 received by the antenna 33 to the wireless signal detection unit 4, passing the wireless communication signal s1 received by the antenna 33 to the communication unit 10, passing the monitoring control result signal s6 transmitted from the communication unit 10 to the antenna 33, and rarely passing the monitoring control result signal s6 transmitted from the communication unit 10 to the wireless signal detection unit 4. The signal separation unit 34 is configured of circulator, duplexer, filter, or the like, for example. Alternatively, it is not configured as a component, but the same function can be realized by a modulation system or a coding means. The function may be realized as part of the functions of the wireless signal detection unit 4 or the communication unit 10.

The signal separation unit 36 separates the wireless startup signal s0 and the wireless communication signal s1 like the signal separation unit 34. The signal separation unit 36 has a function of passing the startup signal transmitted from the startup signal transmission unit 18 to the antenna 35, rarely passing the startup signal transmitted from the startup signal transmission unit 18 to the communication unit 20, passing the wireless communication signal s1 received by the antenna 35 to the communication unit 20, and passing the monitoring control instruction signal s5 transmitted from the communication unit 20 to the antenna 35. The signal separation unit 36 is configured of circulator, duplexer, filter, or the like, for example. Alternatively, it is not configured as a component, but the same function may be realized by a modulation system or a coding means. The function may be realized as part of the functions of the startup signal transmission unit 18 or the communication unit 20.

The power supply control device 1 according to the present exemplary embodiment is configured such that it operates while receiving the wireless startup signal s0 but stops operating while not receiving it, but may be configured such that the logic is inverted, it stops while receiving the wireless startup signal s0 and operates while not receiving it. The logics of the power supply unit control signal s2, the power supply unit control signal s3, and the battery cell monitoring control unit control signal s4 have only to be inverted.

As described above, the structure of the power supply control system according to the present exemplary embodiment is applied thereby to perform startup/stop control by wireless signals and battery cell monitoring control at the same time.

Further, startup/stop control can be stably performed irrespective of battery cell monitoring control contents, execution time, execution cycle, or the like.

Other than when the startup signal is being received, the startup determination circuit, the communication unit, and the battery cell monitoring control unit can be stopped, thereby reducing power consumed in the battery cells.

The wireless startup signal or the wireless communication signal includes the ID of the power supply control device or the like, which enables startup/stop control and battery cell monitoring control on any power supply control device.

A determination threshold of the startup signal is set at the predetermined number of times of reception or at the number of times of reception within a predetermined period of time, thereby preventing erroneous startup or erroneous stop.

The wireless startup signal and the wireless communication signal are separated by a circulator or in a modulation system, thereby performing startup/stop control by wireless signals and battery cell monitoring control at the same time even by one shared antenna.

Second Exemplary Embodiment

A power supply control system for a device including battery cells will be described according to the present exemplary embodiment with reference to the drawings. The description of the same components and functions as in the first exemplary embodiment will be omitted.

Figure 9:
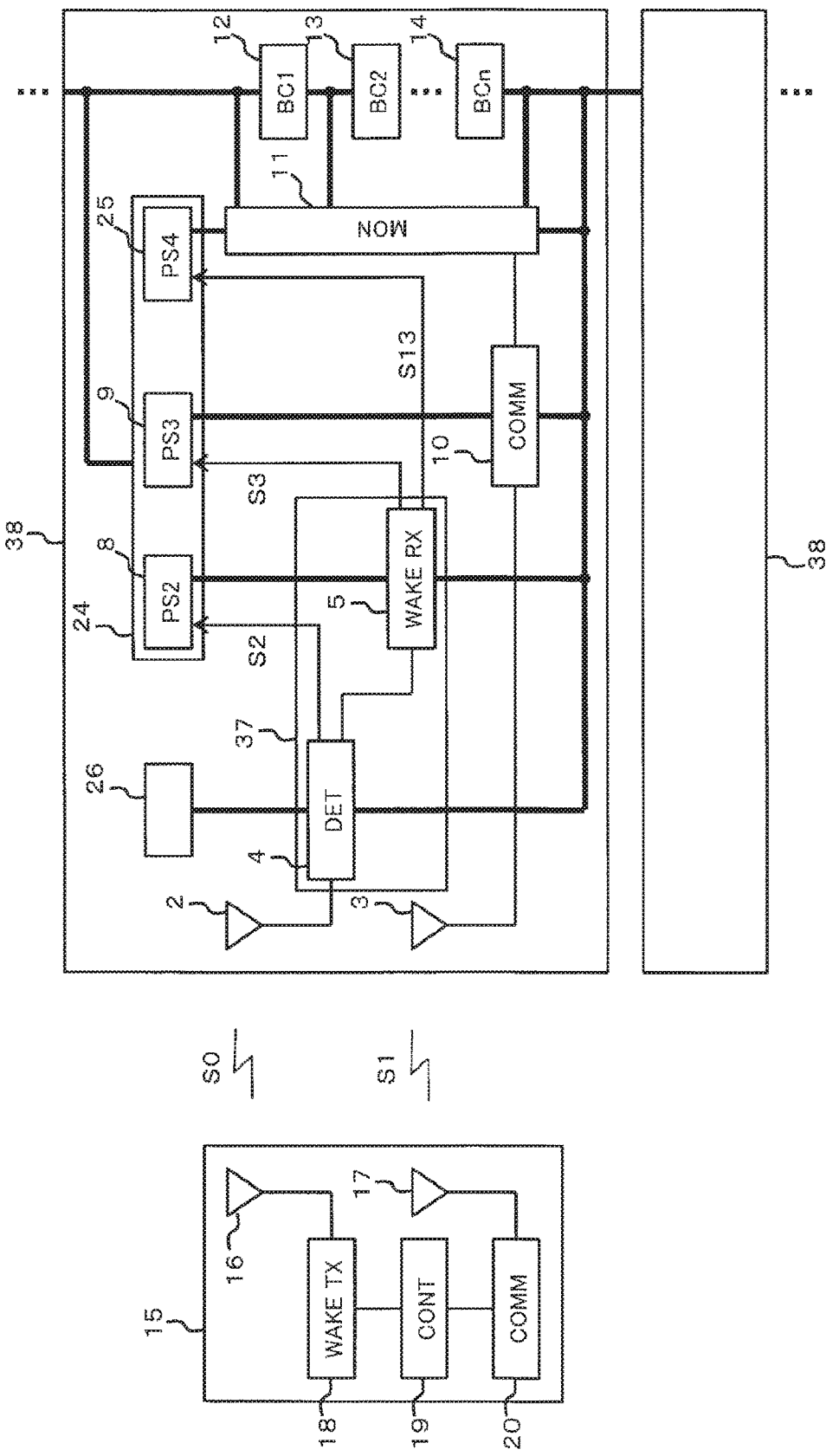
FIG. 9 is a block diagram illustrating an exemplary structure of a power supply control system according to a second exemplary embodiment.

FIG. 9 is a block diagram illustrating an exemplary structure of a power supply control system for a device including batteries. A power supply control device 38 includes a power supply unit 24, a power supply circuit 25, and a power supply unit 26. The wireless signal detection unit 4 is supplied with power from the power supply unit 26 to operate, and the battery cell monitoring control unit 11 is supplied with power from the power supply circuit 25 to operate. When the data pattern of the wireless startup signal s0 matches with a predetermined data pattern, the startup signal determination unit 5 outputs the power supply unit control signal s3 and a power supply unit control signal s13 thereby to operate the power supply circuit 9 and the power supply circuit 25. The power supply circuit 25 operates and supplies power to the battery cell monitoring control unit 11 only when input with the power supply unit control signal s13, and thus the battery cell monitoring control unit 11 does not operate and consume power of the battery cells while the power supply unit control signal s13 is not output.

The power supply unit 26 supplies power from a different power source from the battery cells 12, 13, and 14. For example, a coin-shaped primary battery or small secondary battery is employed as a power source. Alternatively, a power generation device such as solar power generation device, oscillation power generation device, or thermoelectric conversion device may be employed as a power source. Further, there may be configured such that the power supply unit 26 supplies power to not only the wireless signal detection unit 4 but also the startup signal determination unit 5 or the communication unit 10. Further, the startup unit 37, the communication unit 10, and the battery cell monitoring control unit 11 may use power supplied from both the power supply unit 26 and the power supply unit 24. For example, the parts operating at high voltage in the battery cell monitoring control unit 11 operate by power supplied from the battery cells 12, 13, and 14, and the parts operating at low voltage in the battery cell monitoring control unit 11 or the communication unit 10 operate by power supplied from the power supply unit 26. By doing so, the power supplied from the battery cells 12, 13, and 14 can be reduced.

Figure 10:
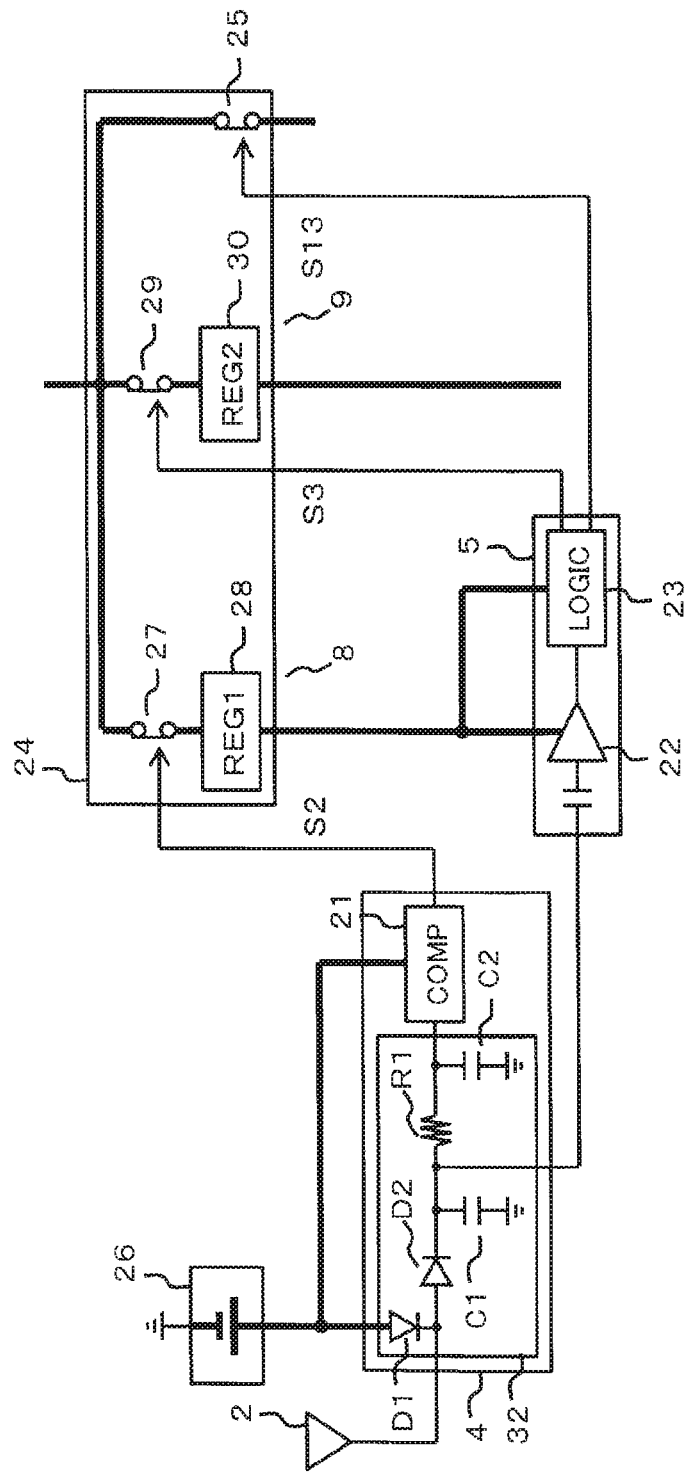
FIG. 10 is a circuit diagram illustrating an exemplary circuit structure of the wireless signal detection unit, the startup signal determination unit, and the power supply units.

FIG. 10 is a circuit diagram illustrating an exemplary circuit structure of the wireless signal detection unit 4, the startup signal determination unit 5, the power supply unit 24, and the power supply unit 26. The power supply unit 26 includes a coin-shaped primary battery, applies a bias voltage to the diode D1, and applies a power supply voltage to the comparator 21. A regulator for adjusting a voltage may be provided between the coin-shaped primary battery and the diode D1 or the comparator 21. The regulator is provided so that even when the voltage of the primary battery changes depending on the amount of remaining charges, the bias voltage or the power supply voltage can be kept constant. The power supply circuit 8 is configured of a switch 27 and a regulator 28, the power supply circuit 9 is configured of a switch 29 and a regulator 30, and the power supply circuit 25 is a switch.

The power supply unit control signal s2 output by the wireless signal detection unit 4 controls the switch 27 to turn on/off. When the signal power of the wireless signal is higher than predetermined power, the High-level power supply unit control signal s2 is output to turn on the switch 27. On the other hand, when the signal power of the wireless signal is lower than predetermined power, the switch 27 is turned off by the Low-level power supply unit control signal s2. When the switch 27 is turned on, the regulator 28 is supplied with power and the regulator 28 starts to operate. The regulator 28, which starts to operate, starts to supply the startup signal determination unit 5 with power so that the startup signal determination unit 5 starts to operate.

It is preferable that the switch 27 is installed between the regulator 28 and the battery cell 12. When the switch 27 is turned off, the regulator 28 is not supplied with power, and thus the regulator 28 does not consume a standby current, thereby reducing current consumption during the reception standby for the wireless startup signal s0.

The power supply unit control signal s3 output by the startup signal determination unit 5 controls the switch 29 to turn on/off. When the data pattern of the wireless signal matches with a predetermined data pattern, the High-level power supply unit control signal s3 is output so that the switch 29 is turned on. On the other hand, when the data pattern of the wireless signal does not match with a predetermined data pattern, the switch 29 is turned off by the Low-level power supply unit control signal s3. When the switch 29 is turned on, the regulator 30 is supplied with power and the regulator 30 starts to operate. The regulator 30, which starts to operate, starts to supply the communication unit 10 with power, and the communication unit 10 starts to operate.

It is preferable that the switch 29 is installed between the regulator 30 and the battery cell 12. When the switch 29 is turned off, the regulator 30 is not supplied with power, and thus the regulator 30 does not consume a standby current, thereby reducing current consumption during the reception standby for the wireless startup signal s0.

The power supply unit control signal s13 output by the startup signal determination unit 5 controls the power supply circuit (switch) 25 to turn on/off. When the data pattern of the wireless signal matches with a predetermined data pattern, the High-level power supply unit control signal s13 is output so that the power supply circuit 25 is turned on. On the other hand, when the data pattern of the wireless signal does not match with a predetermined data pattern, the power supply circuit 25 is turned off by the Low-level power supply unit control signal s13. When the power supply circuit 25 is turned on, the battery cell monitoring control unit 11 is supplied with power and the battery cell monitoring control unit 11 starts to operate. When the power supply circuit 25 is installed between the battery cell monitoring control unit 11 and the battery cell 12, the battery cell monitoring control unit 11 is not supplied with power while the power supply circuit 25 is off, and thus the battery cell monitoring control unit 11 does not consume a standby current, thereby reducing current consumption during the reception standby for the wireless startup signal s0. The power supply circuit 25 may be configured of a switch and a regulator like the power supply circuits 8 and 9.

The wireless signal detection unit 4 may operate by power obtained by rectifying the received wireless signal in the rectification circuit 32 as well as operating by power of the power supply unit 26. In this case, the power supply unit 26 is not required, and it is preferable that a bias voltage applied to the diode D1 is at the same potential as the negative terminals of the capacitors C1 and C2 (the terminals not connected to the resistor R1). Further, the comparator 21 may operate by use of the DC voltage generated by the rectification circuit 32 as power supply voltage. The comparator 21 may operate by use of both power obtained by the rectification circuit 32 and power of the power supply unit 26. The bias voltage of the diode D1 may be applied from the power supply unit 26 and the power supply voltage of the comparator 21 may be applied from the rectification circuit 32. Thereby, the power supplied by the power supply unit 26 can be reduced, and the coin-shaped primary battery provided in the power supply unit 26 can be downsized.

As described above, the structure of the power supply control system according to the present exemplary embodiment is applied thereby to perform startup/stop control by wireless signals and battery cell monitoring control at the same time.

Startup/stop control can be stably performed irrespective of battery cell monitoring control contents, execution time, execution cycle, or the like.

Other than when the startup signal is being received, the startup determination circuit, the communication unit, and the battery cell monitoring control unit can be stopped, thereby reducing power consumed by the battery cells.

The power consumed by the wireless signal detection unit can be supplied from a different power source from the battery cells, thereby reducing power consumed by the battery cells. The power consumed by the battery cells can be eliminated particularly other than when the startup signal is being received.

The wireless startup signal or the wireless communication signal includes the ID of the power supply control device, or the like, thereby performing startup/stop control and battery cell monitoring control on any power supply control device.

A determination threshold of the startup signal can be set at the predetermined number of times of reception or the number of times of reception within a predetermined period of time, thereby preventing erroneous startup or erroneous stop.

The wireless startup signal and the wireless communication signal are separated by a circulator or in a modulation system, thereby performing startup/stop control by wireless signals or battery cell monitoring control at the same time even by one shared antenna.

Further, the present exemplary embodiment can be accomplished in combination with the first exemplary embodiment.

Third Exemplary Embodiment

A power supply control system for a device including battery cells will be described according to the present exemplary embodiment with reference to the drawings. The description of the same components and functions as in the first exemplary embodiment or the second exemplary embodiment will be omitted.

Figure 11:
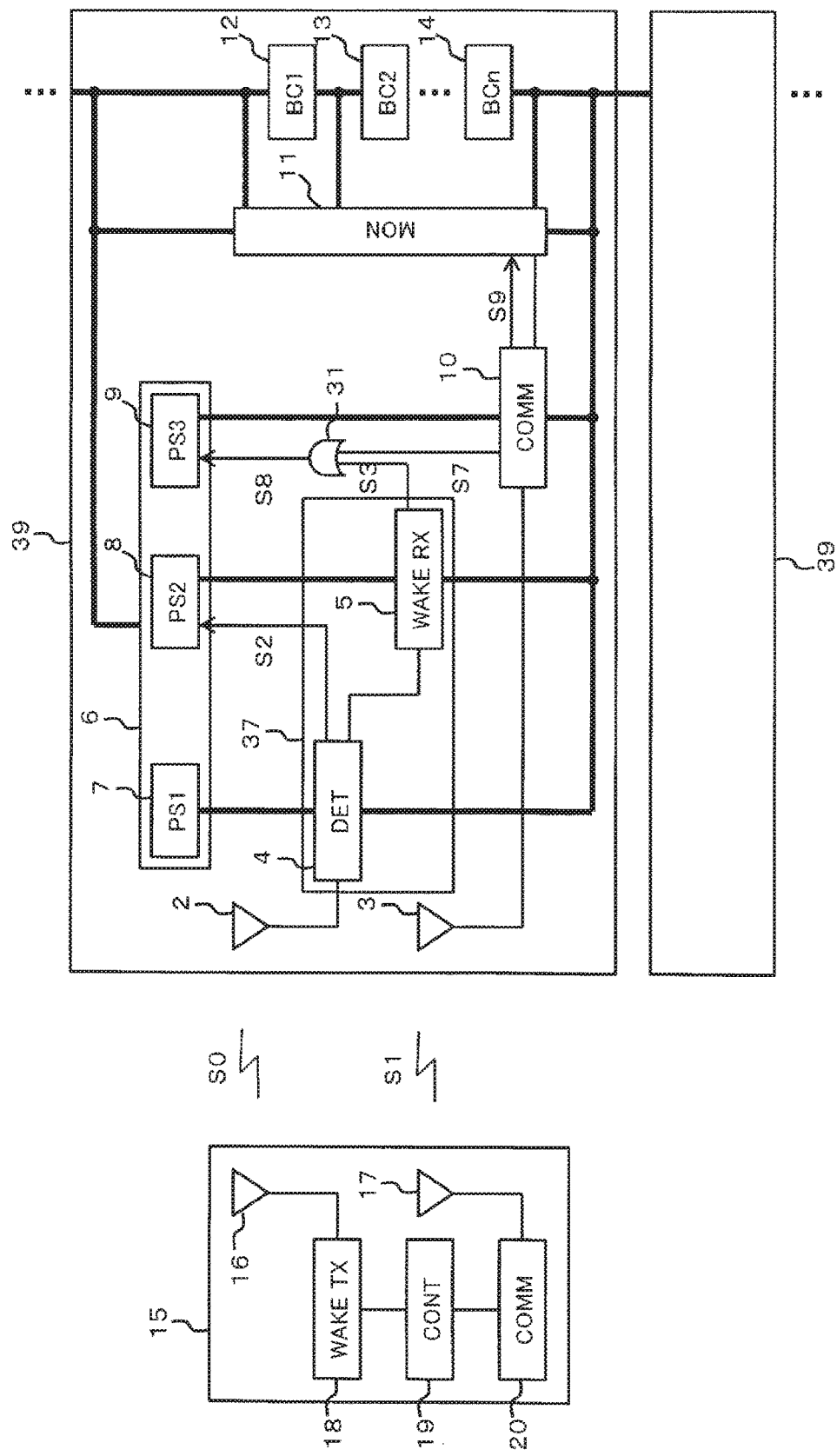
FIG. 11 is a block diagram illustrating an exemplary structure of a power supply control system according to a third exemplary embodiment.

FIG. 11 is a block diagram illustrating an exemplary structure of a power supply control system for a device including batteries. A power supply control device 39 includes a control signal combination unit 31. The control signal combination unit 31 is configured of OR logic, for example, outputs a High-level power supply unit control signal s8 thereby to operate the power supply circuit 9 when either the power supply unit control signal s3 or a power supply unit control signal s7 is at High level. The power supply circuit 9 operates and supplies the communication unit 10 with power only when input with the High-level power supply unit control signal s8, and thus when the High-level power supply unit control signal s8 is not output, the communication unit 10 does not operate and consume power of the battery cells. It is preferable that the control signal combination unit 31 is supplied with power from the power supply circuit 7 or the power supply circuit 8. Alternatively, it is preferable that power is supplied by use of both the power supply circuit 8 and the power supply circuit 9. Alternatively, it is preferable that power is supplied from both the power supply unit control signal s3 and the power supply unit control signal s7.

When the data pattern of the wireless startup signal s0 matches with a predetermined data pattern, the startup signal determination unit 5 outputs the High-level power supply unit control signal s3. The communication unit 10 outputs the High-level power supply unit control signal s7 for a predetermined period of time when the power supply circuit 9 is not desired to stop. A predetermined period of time when the power supply circuit 9 is not desired to stop is during communication with the master controller 15, while the battery cell monitoring control unit 11 is monitoring and controlling the battery cells, or during other operation instructed by the master controller 15, for example. When the startup signal determination unit 5 and the communication unit 10 are not supplied with power, the power supply unit control signals s3 and s7 are at Low level.

Figure 12:
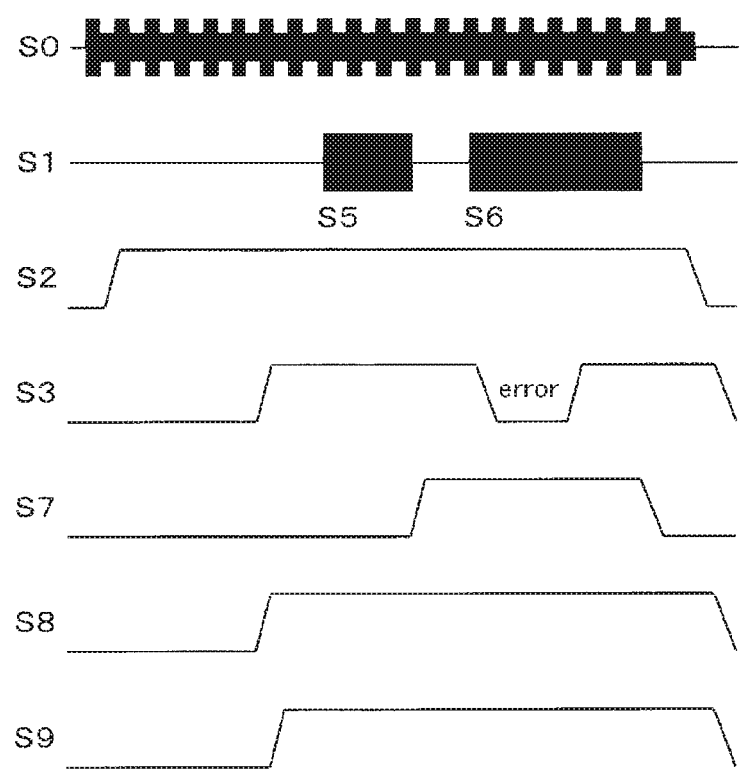
FIG. 12 illustrates exemplary signal waveforms for explaining an exemplary operation of the power supply control device.

FIG. 12 illustrates exemplary signal waveforms for explaining an exemplary operation of the power supply control device 39. FIG. 12 illustrates the wireless startup signal s0, the wireless communication signal s1, the power supply unit control signals s2, s3, s7, s8, and the battery cell monitoring control unit control signal s9 in time series. The wireless communication signal s1 includes the monitoring control instruction signal s5 and the monitoring control result signal s6. The power supply unit control signals s2, s3, s7, s8 and the battery cell monitoring control unit control signal s9 are all digital signals.

When the wireless startup signal s0 is received by the power supply control device 39, the wireless signal detection unit 4 detects the wireless startup signal s0 and outputs the High-level power supply unit control signal s2. When the High-level power supply unit control signal s2 is output, the startup signal determination unit 5 starts to operate. The startup signal determination unit 5 determines the data pattern of the wireless startup signal s0 and outputs the High-level power supply unit control signal s3. The control signal combination unit 31 takes the OR logic of the High-level power supply unit control signal s3 and the Low-level power supply unit control signal s7, and outputs the High-level power supply unit control signal s8. When the High-level power supply unit control signal s8 is output, the communication unit 10 starts to operate. The communication unit 10 outputs the High-level battery cell monitoring control unit control signal s9. When the High-level battery cell monitoring control unit control signal s9 is output, the battery cell monitoring control unit 11 starts to operate. Thereafter, the communication unit 10 receives the monitoring control instruction signal s5. Herein, the communication unit 10 outputs the High-level power supply unit control signal s7. The power supply unit control signal s7 is assumed at High level until battery cell monitoring control by the battery cell monitoring control unit 11 and transmission of the monitoring control result signal s6 by the communication unit 10 are completed. By doing so, for example, even when the data pattern of the wireless startup signal s0 is erroneously determined due to noise while the communication unit 10 is transmitting the monitoring control result signal s6, and the power supply unit control signal s3 is changed to Low level, the power supply unit control signal s7 is at High level and thus the control signal combination unit 31 continues to output the High-level power supply unit control signal s8. Consequently, the communication unit 10 continues to be supplied with power, and can transmit the monitoring control result signal s6.

When the monitoring control is terminated, the master controller 15 stops transmitting the wireless startup signal s0. When the wireless startup signal s0 is not received by the power supply control device 1, the startup signal determination unit 5 cannot determines the data pattern of the wireless startup signal s0, and stops outputting the High-level power supply unit control signal s3 to be at Low level. At this time, the power supply unit control signal s7 is also at Low level, and thus the control signal combination unit 31 also stops outputting the High-level power supply unit control signal s8 to be at Low level. The communication unit 10 then stops operating, and the battery cell monitoring control unit control signal s9 enters Low level. When the battery cell monitoring control unit control signal s9 enters Low level, the battery cell monitoring control unit 11 also stops operating. Further, the wireless signal detection unit 4 cannot detect the wireless startup signal s0, and stops outputting the High-level power supply unit control signal s2 to be at Low level. Thereby, the startup signal determination unit 5 stops operating. In this way, when the wireless startup signal s0 stops being transmitted, the startup signal determination unit 5, the communication unit 10, and the battery cell monitoring control unit 11 in the power supply control device 39 stop operating.

Figure 13:
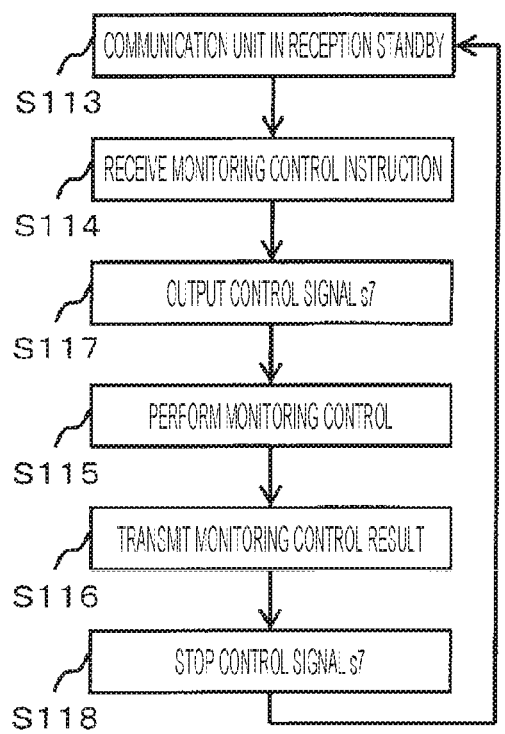
FIG. 13 is a flowchart for explaining an exemplary operation of the communication unit.

FIG. 13 is a flowchart for explaining an exemplary operation of the communication unit 10. The communication unit 10 is operating while supplied with power from the power supply circuit 9. At first, the communication unit 10 transits to the reception standby state in order to receive a monitoring control instruction from the master controller 15 (S113). The communication unit 10 then receives a monitoring control instruction transmitted from the master controller 15 (S114). After receiving the monitoring control instruction, the communication unit 10 outputs the High-level power supply unit control signal s7, and operates the power supply circuit 9 irrespective of a determination result of the startup signal determination unit 5 (S117). A potential level of the power supply unit control signal s7 may be determined in response to the monitoring control instruction from the master controller 15. The communication unit 10 performs monitoring control on the battery cells in response to the received monitoring control instruction (S115), and transmits the result to the master controller 15 (116). Thereafter, the communication unit 10 returns the power supply unit control signal s7 to Low level, and causes the startup signal determination unit 5 to perform operation control on the power supply circuit 9 (S118). The communication unit 10 then returns to the reception standby S113 again, and waits for a next monitoring control instruction. In this way, while supplied with power, the communication unit 10 receives a monitoring control instruction from the master controller 15, outputs the power supply unit control signal s7, performs monitoring control, and transmits a monitoring control result.

Figure 14:
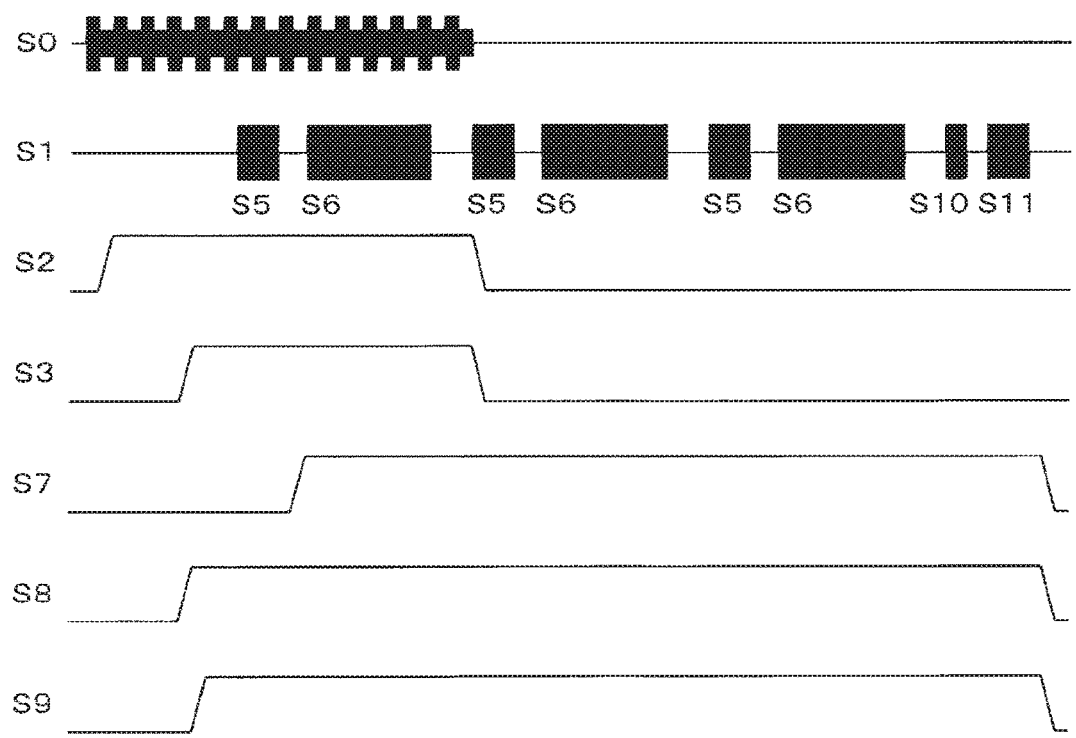
FIG. 14 illustrates exemplary signal waveforms for explaining an exemplary operation of the power supply control device.

FIG. 14 illustrates exemplary signal waveforms for explaining an exemplary operation of the power supply control device 39. FIG. 14 illustrates the wireless startup signal s0, the wireless communication signal s1, the power supply unit control signals s2, s3, s7, s8, and the battery cell monitoring control unit control signal s9 in time series. The wireless communication signal s1 includes the monitoring control instruction signal s5, the monitoring control result signal s6, a wireless stop signal s10, and a delivery confirmation signal s11. The power supply unit control signals s2, s3, s7, s8 and the battery cell monitoring control unit control signal s9 are all digital signals in this example.

When the wireless startup signal s0 is received by the power supply control device 39, the wireless signal detection unit 4 detects the wireless startup signal s0 and outputs the High-level power supply unit control signal s2. The startup signal determination unit 5, which starts to operate, determines the data pattern of the wireless startup signal s0, and outputs the High-level power supply unit control signal s3. The control signal combination unit 31 takes the OR logic of the High-level power supply unit control signal s3 and the Low-level power supply unit control signal s7, and outputs the High-level power supply unit control signal s8. The communication unit 10, which starts to operate, outputs the High-level battery cell monitoring control unit control signal s9. Thereafter, the communication unit 10 receives the monitoring control instruction signal s5. Herein, the communication unit 10 outputs the High-level power supply unit control signal s7. The power supply unit control signal s7 is assumed at High level until the communication unit 10 receives the wireless stop signal s10 from the master controller 15 and transmits the delivery confirmation signal s11 to the master controller 15. Even when the master controller 15 then stops transmitting the wireless startup signal s0 and the power supply unit control signals s2 and s3 enter Low level, the power supply unit control signal s7 is at High level, and thus the control signal combination unit 31 continues to output the High-level power supply unit control signal s8. Consequently, the communication unit 10 continues to be supplied with power, can receive the monitoring control signal s5, perform monitoring control, and transmit the monitoring control result signal s6. Thereby, the master controller 15 can stop transmitting the wireless startup signal s0, reduce power consumption, and increase the available frequencies to the wireless communication signal s1.

When monitoring control is terminated, the master controller 15 transmits the wireless stop signal s10. The power supply control device 39, which receives the wireless stop signal s10, transmits the delivery confirmation signal s11, and sets the power supply unit control signal s7 and the battery monitoring control unit control signal s9 at Low level. Then, the power supply unit control signal s8 output by the control signal combination unit 31 also enters Low level. Thereby, the communication unit 10 and the battery cell monitoring control unit 11 also stop operating. In this way, the operation stop mode by the wireless startup signal s0 can be switched to the operation stop mode by the wireless stop signal s10.

It is preferable that the operation stop mode is switched depending on a communication failure probability of the wireless communication signal s1 or a situation of the power supply control device 39. A situation of the power supply control device 39 is a difference in situation during driving, storage, and maintenance of the power supply control device 39, a difference in radio wave propagation environment between the master controller 15 and the power supply control device 39, a difference in number of power supply control devices 39 to be monitored and controlled, or the like. The operation stop mode is not limited to the above, and may employ various conditions such as a mode to stop when the wireless communication signal s1 cannot be received for a predetermined period of time, and a mode to stop when a communication failure probability of the wireless communication signal s1 exceeds a predetermined probability. A transmission interval of the wireless startup signal s0 is also assumed to be changed. Thereby, optimum operation management and battery cell monitoring control are enabled depending on a situation of the master controller 15 and the power supply control device 39.

Figure 15:
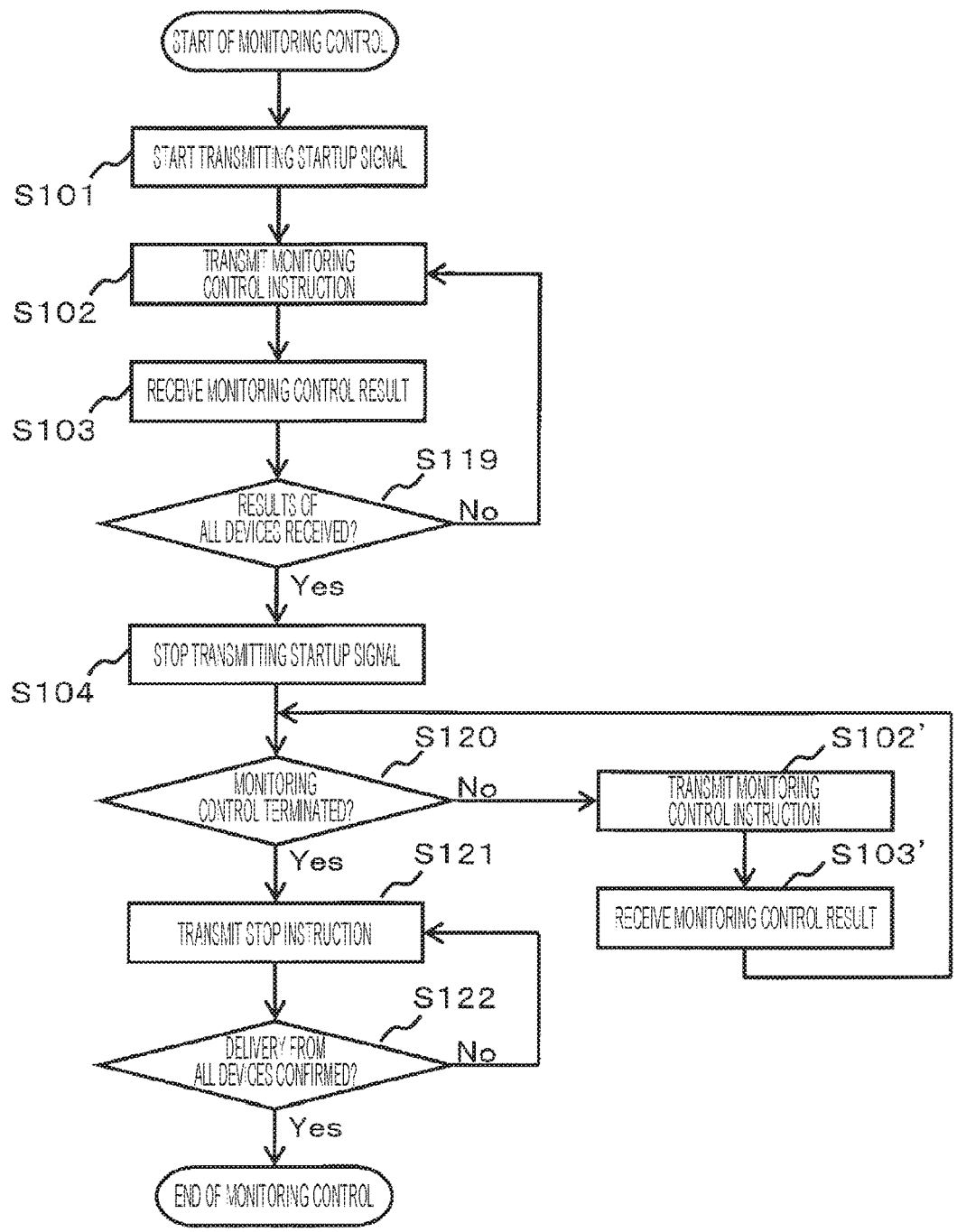
FIG. 15 is a flowchart for explaining an exemplary operation of the master controller/

FIG. 15 is a flowchart for explaining an exemplary operation of the master controller 15. The master controller 15 starts predetermined monitoring control in response to an instruction of a higher-order system or depending on a situation of the power supply control device 39 or a situation of the master controller 15. At first, the master controller 15 starts to transmit the wireless startup signal (S101). After a time elapses in which the communication unit 10 in the power supply control device 39 is expected to start to operate, the master controller 15 transmits a monitoring control instruction to the power supply control device 39 (S102). The master controller 15 then receives a monitoring control result from the power supply control device 39 which performs monitoring control on the battery cells (S103). The master controller 15 then determines whether it receives the monitoring control results from all the power supply control devices 39 (S119). When receiving the monitoring control results from all the power supply control devices 39, the master controller 15 stops transmitting the wireless startup signal (S104). When not being able to receive the monitoring control results from any power supply control devices 39, the master controller 15 continues to transmit the wireless startup signal and performs the monitoring control instruction transmission S102 again. The master controller 15 determines whether the predetermined monitoring control is terminated (S120) after the wireless startup signal transmission stop S104. Whether the predetermined monitoring control is terminated may be determined by the master controller 15 depending on whether a predetermined condition is met, or may be controlled when a signal is input from another system (not illustrated) into the control unit 19. A predetermined condition is that a predetermined period of time elapses or that a predetermined monitoring control result is obtained.

When the predetermined monitoring control is not terminated, the master controller 15 continues the monitoring control instruction transmission S102' and the monitoring control result reception S103'. When the predetermined monitoring control is terminated, the master controller 15 transmits the wireless stop signal (S121). The master controller 15 then determines whether it receives the delivery confirmations from all the power supply control devices 39 in order to confirm whether the wireless stop signal is received by the power supply control devices 39 (S122). When receiving the delivery confirmations from all the power supply control devices 39, the master controller 15 terminates the monitoring control. When not being able to receive the delivery confirmations from any power supply control devices 39, the master controller 15 performs the wireless stop signal transmission S121. In this way, the master controller 15 repeatedly performs the wireless stop signal transmission S121 until receiving the delivery confirmations from all the power supply control devices 39. Thereby, it is possible to accurately stop all the power supply control devices 39. Further, after a predetermined period of time elapses, the delivery confirmation S122 of all the power supply control devices 39 is interrupted and then the monitoring control may be terminated. In this case, when not being able to receive the wireless communication signal s1 for a predetermined period of time or when a communication failure probability of the wireless communication signal s1 is a predetermined probability or more, the power supply control devices 39 are assumed to stop operating. By doing so, the operations can be stopped even when a radio wave propagation environment between the master controller 15 and the power supply control devices 39 is deteriorated.

As described above, the structure of the power supply control system according to the present exemplary embodiment is applied thereby to perform startup/stop control by wireless signals and battery cell monitoring control at the same time.

Further, startup/stop control can be stably performed irrespective of battery cell monitoring control contents, execution time, execution cycle, or the like.

The communication unit controls the power supply circuit, thereby further stabilizing power supply during communication or battery cell monitoring control.

The communication unit controls the power supply circuit so that the master control can stop transmitting the wireless startup signal, or spread the transmission intervals.

The wireless startup signal or the wireless communication signal includes the ID of the power supply control device, thereby performing startup/stop control and battery cell monitoring control on any power supply control device.

A determination threshold of the startup signal is set at the predetermined number of times of reception or the number of times of reception within a predetermined period of time, thereby preventing erroneous startup or erroneous stop.

The wireless startup signal and the wireless communication signal are separated by a circulator or in a modulation system, thereby performing startup/stop control by wireless signals and battery cell monitoring control at the same time even by one shared antenna.

The present exemplary embodiment can be accomplished in combination with the first exemplary embodiment or the second exemplary embodiment.

Fourth Exemplary Embodiment

A power supply control system for a device including battery cells will be described according to the present exemplary embodiment with reference to the drawings. The description of the same components and functions as in the first exemplary embodiment, the second exemplary embodiment, or the third exemplary embodiment will be omitted.

FIG. 16 is a block diagram illustrating an exemplary structure of a power supply control system for a device including batteries. A power supply control instruction signal s12 is output from the communication unit 10 to the startup signal determination unit 5 in a power supply control device 40. The startup signal determination unit 5 changes the potential levels of the power supply unit control signal s3 and the battery cell monitoring control unit control signal s4 depending on the input power supply control instruction signal s12 until a predetermined condition is met. For example, even when the data pattern of the wireless startup signal s0 matches with a predetermined data pattern, the power supply unit control signal s3 and the battery cell monitoring control unit control signal s4 are changed to Low level until a predetermined period of time elapses, or the predetermined data pattern for determining the matching is changed to another data pattern, or they are combined. Alternatively, even when the data pattern of the wireless startup signal s0 does not match with a predetermined data pattern, the power supply unit control signal s3 and the battery cell monitoring control unit control signal s4 may be changed to High level. The power supply unit control signal s3 and the battery cell monitoring control unit control signal s4 may not be controlled always at the same potential. For example, when communication with the master controller 15 is only required, the power supply unit control signal s3 is set at High level and the battery cell monitoring control unit control signal s4 is set at Low level. Further, when monitoring and controlling the battery cells 12, 13, and 14 is only required, the power supply unit control signal s3 is set at Low level and the battery cell monitoring control unit control signal s4 is set at High level.

First Operation Example

Figure 17:
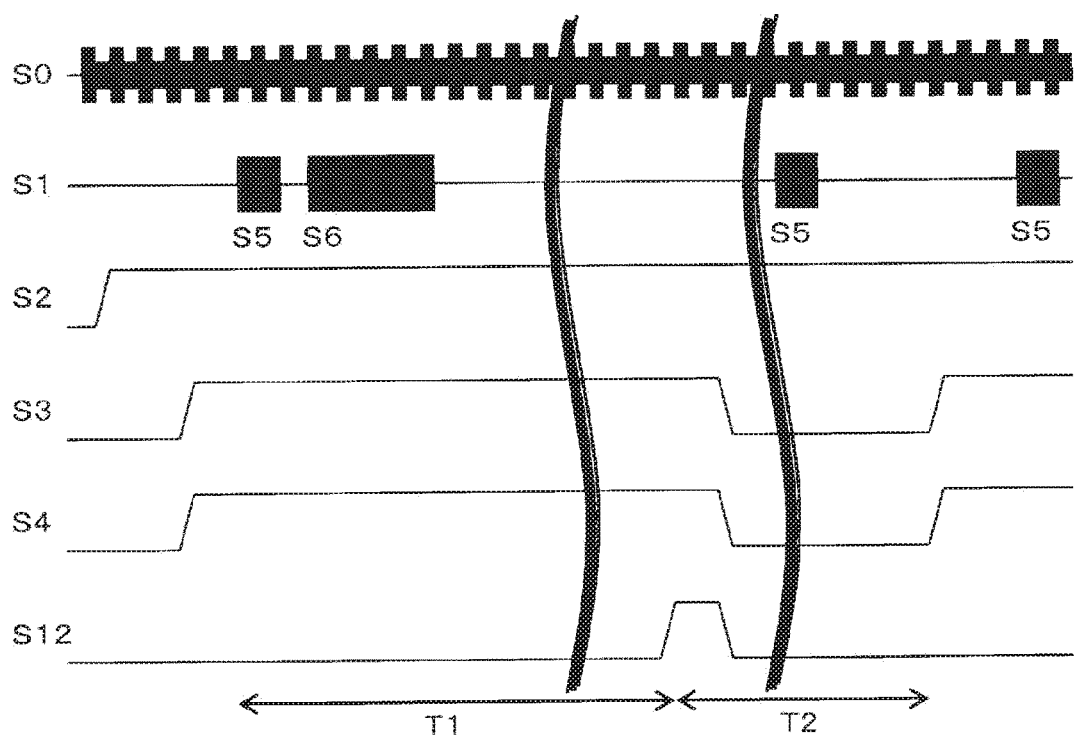
FIG. 17 illustrates exemplary signal waveforms for explaining a first operation example of the power supply control device.

FIG. 17 illustrates exemplary signal waveforms for explaining a first operation example of the power supply control device 40. FIG. 17 illustrates the wireless startup signal s0, the wireless communication signal s1, the power supply unit control signals s2, s3, the battery cell monitoring control unit control signal s4, and the power supply control instruction signal s12 in time series. The wireless communication signal s1 includes the monitoring control instruction signal s5 and the monitoring control result signal s6. The power supply unit control signals s2, s3, the battery cell monitoring control unit control signal s4, and the power supply control instruction signal s12 are all digital signals in this example.

When the wireless startup signal s0 is received by the power supply control device 40, the wireless signal detection unit 4 detects the wireless startup signal s0 and outputs the High-level power supply unit control signal s2. The startup signal determination unit 5, which starts to operate, determines the data pattern of the wireless startup signal s0, and outputs the High-level power supply unit control signal s3 and the High-level battery cell monitoring control unit control signal s4. The communication unit 10, which starts to operate, receives the monitoring control instruction signal s5, and the battery cell monitoring control unit 11 performs monitoring control on the battery cells. The communication unit 10 then transmits the monitoring control result signal s6, and then enters the reception standby for the monitoring control instruction signal s5 again. However, when not being able to receive the monitoring control instruction signal s5 for a predetermined period of time T1 (for example, after receiving the monitoring control instruction signal s5, or detecting a data pattern, or the end of reception), the communication unit 10 outputs the High-level power supply control instruction signal s12, and the startup signal determination unit 5 changes the power supply unit control signal s3 and the battery cell monitoring control unit control signal s4 to Low level. The communication unit 10 and the battery cell monitoring control unit 11 then stop operating, and the power supply control instruction signal s12 also enters Low level. The startup signal determination unit 5 keeps the power supply unit control signal s3 and the battery cell monitoring control unit control signal s4 at Low level for a predetermined period of time T2 after the High-level power supply control instruction signal s12 is output, and then returns to the original determination operation. That is, after the predetermined period of time T2 elapses, when the data pattern of the wireless startup signal s0 matches with a predetermined data pattern, the startup signal determination unit 5 outputs the High-level power supply unit control signal s3 and the High-level battery cell monitoring control unit control signal s4.

By doing so, when a communication environment between the master controller 15 and the power supply control device 40 is deteriorated and the battery cells are difficult to monitor and control, the communication unit 10 and the battery cell monitoring control unit 11 stop operating, thereby restricting power consumption. A condition that the startup signal determination unit 5 returns to the original determination operation after the High-level power supply control instruction signal s12 is output is not limited to the predetermined period of time T2. For example, the condition may employ not a time but a data pattern for determining the wireless startup signal s0, or a reception success probability of the wireless startup signal s0.

Figure 18:
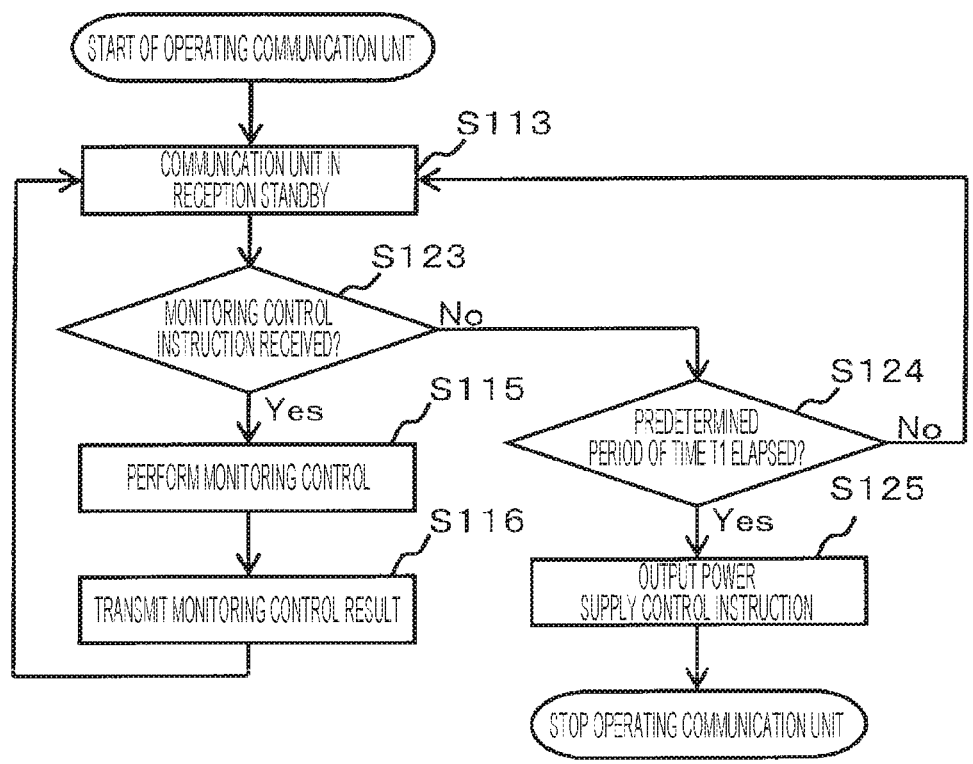
FIG. 18 is a flowchart for explaining a first operation example of the communication unit.

FIG. 18 is a flowchart for explaining a first operation example of the communication unit 10. The communication unit 10 is operating while supplied with power from the power supply circuit 9. At first, the communication unit 10 transits to the reception standby state in order to receive a monitoring control instruction from the master controller 15 (S113). The communication unit 10 then determines whether it can receive a monitoring control instruction transmitted from the master controller 15 (S123). When being able to receive the monitoring control instruction, the communication unit 10 performs monitoring control on the battery cells in response to the received monitoring control instruction (S115), transmits the result to the master controller 15 (S116), and transits to the reception standby S113 again. While not being able to receive the monitoring control instruction, the communication unit 10 determines whether the predetermined period of time T1 has elapsed (S124). The communication unit 10 is in the reception standby S113 until the predetermined period of time T1 elapses, and outputs the High-level power supply control instruction signal s12 when the predetermined period of time T1 elapses. The communication unit 10 then stops operating. As describe above, since desired battery cell monitoring control cannot be performed while the wireless communication signal s1 cannot be received, the communication unit 10 and the battery cell monitoring control unit 11 are stopped, thereby restricting power consumption.

Figure 19:
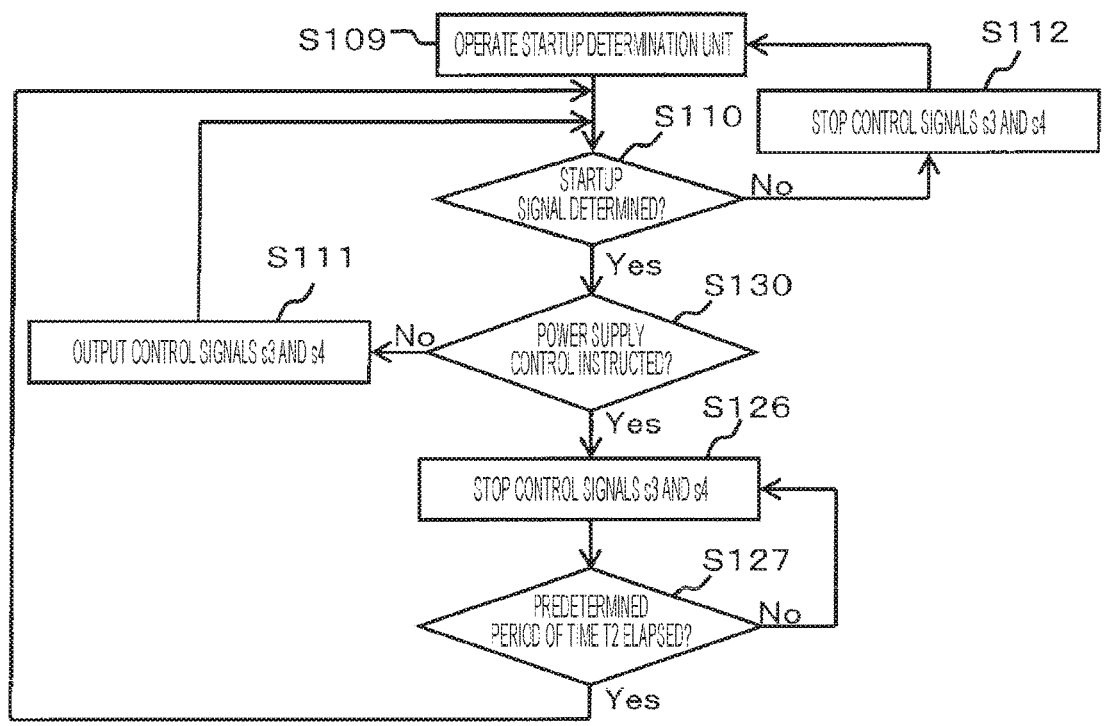
FIG. 19 is a flowchart for explaining a first operation example of the startup signal determination unit.

FIG. 19 is a flowchart for explaining a first operation example of the startup signal determination unit 5. The startup signal determination unit 5 is operating while supplied with power from the power supply circuit 8 (S109). At first, the startup signal determination unit 5 determines whether the data pattern of a wireless signal detected by the wireless signal detection unit 4 matches with a predetermined data pattern (S110). When the data patterns do not match with each other, the startup signal determination unit 5 sets the power supply unit control signal s3 and the battery cell monitoring control unit control signal s4 at Low level (S112). The startup signal determination unit 5 then proceeds to the startup signal determination S110 again. When the data patterns match with each other, the startup signal determination unit 5 determines the power supply control instruction signal s12 output from the communication unit 10 (S130). When the power supply control instruction signal s12 is at Low level, the startup signal determination unit 5 outputs the power supply unit control signal s3 and the battery cell monitoring control unit control signal s4 at High level in order to start up the communication unit 10 and the battery cell monitoring control unit 11 (S111), and proceeds to the startup signal determination S110 again. When the power supply control instruction signal s12 is at High level, the startup signal determination unit 5 sets the power supply unit control signal s3 and the battery cell monitoring control unit control signal s4 at Low level (S126). Thereby, the communication unit 10 and the battery cell monitoring control unit 11 stops. The startup signal determination unit 5 determines whether the predetermined period of time T2 has elapsed (S127). The startup signal determination unit 5 keeps the state in S126 until the predetermined period of time T2 elapses, and proceeds to the startup signal determination S110 again when the predetermined period of time T2 elapses. In this way, when the High-level power supply control instruction signal s12 is input from the communication unit 10, the communication unit 10 and the battery cell monitoring control unit 11 are stopped.

Second Operation Example

Figure 20:
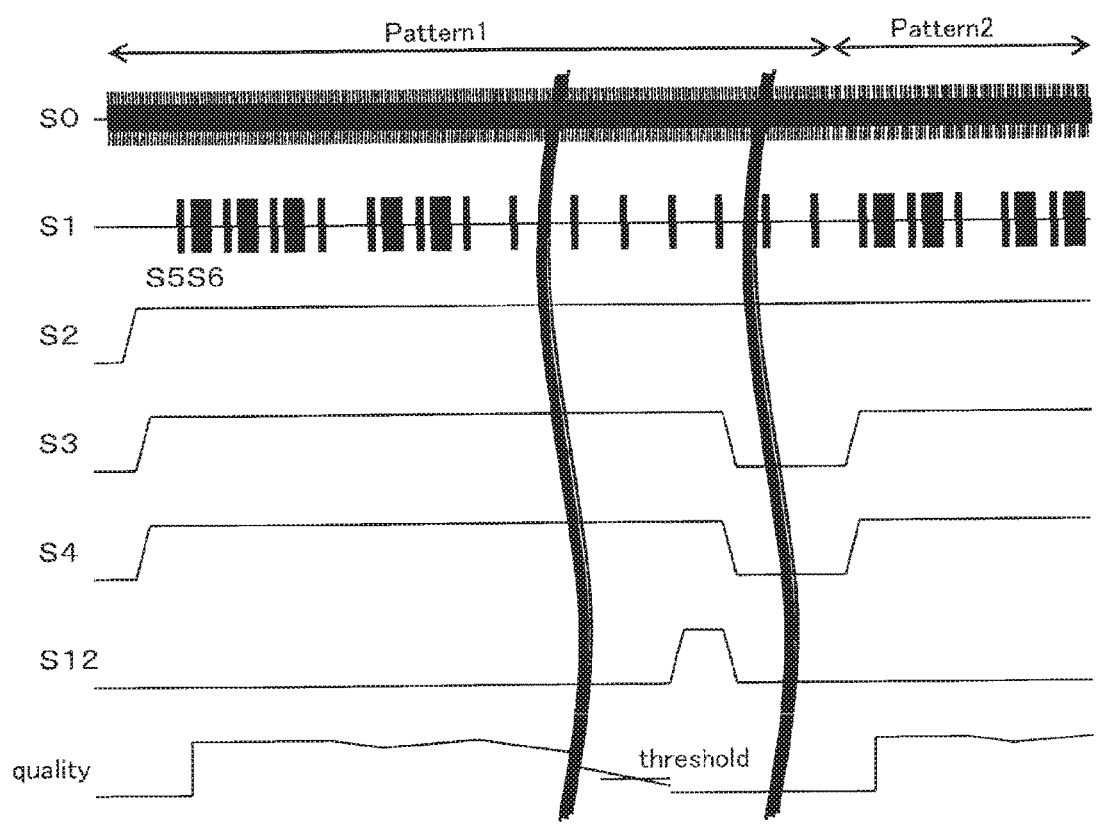
FIG. 20 illustrates exemplary signal waveforms for explaining a second operation example of the power supply control device.

FIG. 20 illustrates exemplary signal waveforms for explaining a second operation example of the power supply control device 40. FIG. 20 illustrates the wireless startup signal s0, the wireless communication signal s1, the power supply unit control signals s2, s3, the battery cell monitoring control unit control signal s4, and the power supply control instruction signal s12 in time series. The wireless communication signal s1 includes the monitoring control instruction signal s5 and the monitoring control result signal s6. The power supply unit control signals s2, s3, the battery cell monitoring control unit control signal s4, and the power supply control instruction signal s12 are all digital signals in this example. FIG. 20 illustrates communication quality of the wireless communication signal s1.

When the wireless startup signal s0 is received by the power supply control device 40, the wireless signal detection unit 4 detects the wireless startup signal s0, and outputs the High-level power supply unit control signal s2. The startup signal determination unit 5, which starts to operate, determines that the data pattern of the wireless startup signal s0 matches with a predetermined data pattern (pattern 1), and outputs the High-level power supply unit control signal s3 and the High-level battery cell monitoring control unit control signal s4. The communication unit 10, which starts to operate, receives the monitoring control instruction signal s5, and the battery cell monitoring control unit 11 performs monitoring control on the battery cells. The communication unit 10 then transmits the monitoring control result signal s6, and then receives the monitoring control instruction signal s5 again.

There will be considered herein a case in which the monitoring control instruction signal s5 fails to be received at a certain probability depending on a radio wave propagation environment or interfering wave between the master controller 15 and the power supply control device 40 due to repetition of the reception of the monitoring control instruction signal s5 and the transmission of the monitoring control result signal s6. The communication quality is a parameter which decreases when the monitoring control instruction signal s5 fails to be received and increases when the monitoring control instruction signal s5 is successfully received, such as packet error rate. Alternatively, the communication quality may employ a reception signal intensity of the monitoring control instruction signal. When the reception signal intensity is low, the reception failure probability increases. The information on the communication quality based on the monitoring control instruction signal s5 is acquired when the power supply control device 40 receives the monitoring control instruction signal s5. The reception failure can be known by reception of the previous and next monitoring control instruction signals s5. For example, when an incremental packet ID is given to the monitoring control instruction signal s5, the packet ID of the received monitoring control instruction signal s5 is checked thereby to grasp how many monitoring control instruction signals s5 that fails to be received there are between two successfully-received monitoring control instruction signals s5. Reception success/failure or reception signal intensity of the monitoring control result signal s6 by the master controller 15 is notified to the power supply control device 40 via the monitoring control instruction signal s5, which can be considered for the communication quality. Alternatively, the communication quality may be notified from the master controller 15 to the power supply control device 40 via the monitoring control instruction signal s5.

When the communication quality lowers below a predetermined threshold, the communication unit 10 outputs the High-level power supply control instruction signal s12, and the startup signal determination unit 5 changes the power supply unit control signal s3 and the battery cell monitoring control unit control signal s4 to Low level. The communication unit 10 and the battery cell monitoring control unit 11 then stop operating, and the power supply control instruction signal s12 also enters Low level. After the High-level power supply control instruction signal s12 is output, the startup signal determination unit 5 changes the predetermined data pattern used for startup determination to another data pattern (pattern 2). Thereafter, when the master controller 15 starts to transmit the wireless startup signal s0 having the data pattern of the pattern 2, the startup signal determination unit 5 determines that the data pattern of the wireless startup signal s0 matches with the data pattern of the pattern 2, and outputs the High-level power supply unit control signal s3 and the High-level battery cell monitoring control unit control signal s4. By doing so, when the battery cells are difficult to monitor and control since a communication environment between the master controller 15 and the power supply control device 40 is deteriorated, the communication unit 10 and the battery cell monitoring control unit 11 stop operating, thereby restricting power consumption. Further, when the communication environment is improved or when monitoring control needs to be tried even at a low monitoring control success probability, the master controller 15 transmits the wireless startup signal s0 having the data pattern of the pattern 2 thereby to set the power supply unit control signal s3 and the battery cell monitoring control unit control signal s4 at High level again and to perform monitoring control on the battery cells. The condition that the startup signal determination unit 5 performs the determination operation after the High-level power supply control instruction signal s12 is output is not limited to changing a determination data pattern. For example, the determination operation may be stopped until a predetermined period of time elapses, or a reception success probability of the wireless startup signal s0 may be employed as a condition.

There may be configured such that when determining that the monitoring control result cannot be received within a predefined period of time after a monitoring control instruction or when instructed by other device, the master controller 15 changes a data pattern.

Figure 21:
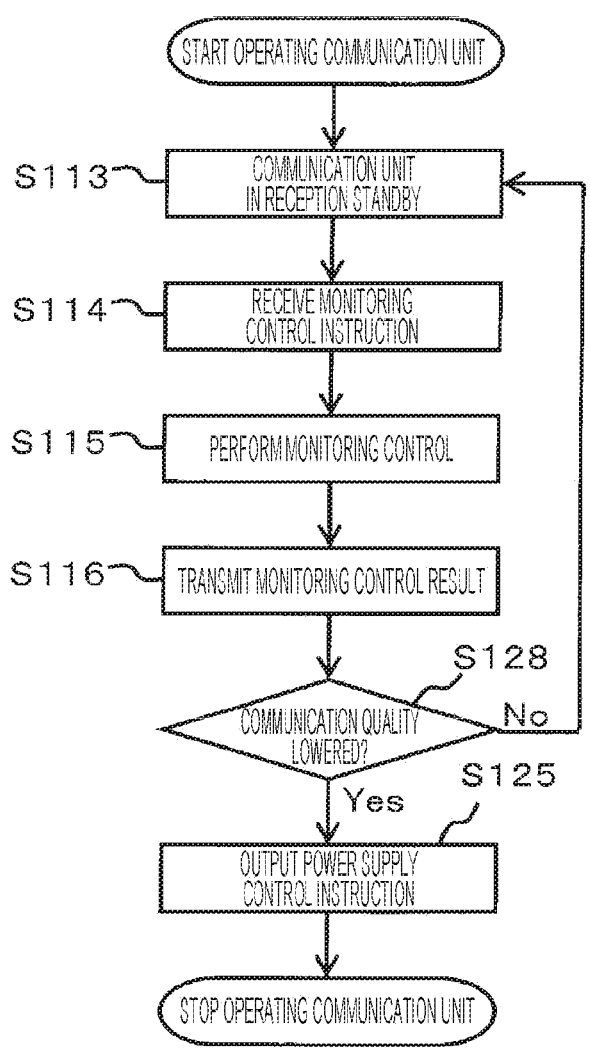
FIG. 21 is a flowchart for explaining a second operation example of the communication unit.

FIG. 21 is a flowchart for explaining a second operation example of the communication unit 10. The communication unit 10 is operating while supplied with power from the power supply circuit 9. At first, the communication unit 10 transits to the reception standby state in order to receive a monitoring control instruction from the master controller 15 (S113). The communication unit 10 then receives a monitoring control instruction transmitted from the master controller 15 (S114). When receiving the monitoring control instruction, the communication unit 10 performs monitoring control on the battery cells in response to the received monitoring control instruction (S115), and transmits the result to the master controller 15 (S116). Thereafter, the communication unit 10 determines whether the communication quality lowers below a predetermined value (S128). When the communication quality does not lower below the predetermined value, the communication unit 10 enters the reception standby state S113 again. When the communication quality lowers below the predetermined value, the communication unit 10 outputs the High-level power supply control instruction signal s12. The communication unit 10 then stops operating. In this way, since desired battery cell monitoring control is difficult while the communication via the wireless communication signal s1 cannot be made at sufficient quality, the communication unit 10 and the battery cell monitoring control unit 11 are stopped thereby to restrict power consumption.

Figure 22:
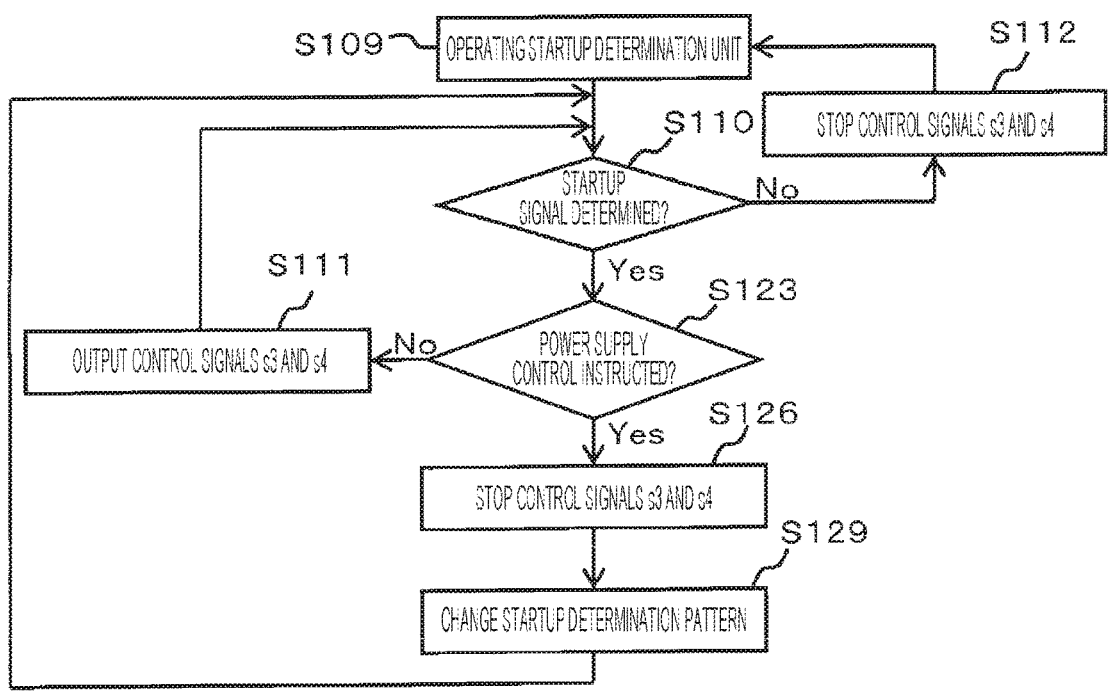
FIG. 22 is a flowchart for explaining a second operation example of the startup signal determination unit.

FIG. 22 is a flowchart for explaining a second operation example of the startup signal determination unit 5. The startup signal determination unit 5 is operating while supplied with power from the power supply circuit 8 (S109). At first, the startup signal determination unit 5 determines whether the data pattern of a wireless signal detected by the wireless signal detection unit 4 matches with a predetermined data pattern (S110). When the data patterns do not match with each other, the startup signal determination unit 5 sets the power supply unit control signal s3 and the battery cell monitoring control unit control signal s4 at Low level (S112). The startup signal determination unit 5 then proceeds to the startup signal determination S110 again. When the data patterns match with each other, the startup signal determination unit 5 determines the power supply control instruction signal s12 output from the communication unit 10 (S123). When the power supply control instruction signal s12 is at Low level, the startup signal determination unit 5 outputs the power supply unit control signal s3 and the battery cell monitoring control unit control signal s4 at High level in order to start up the communication unit 10 and the battery cell monitoring control unit 11 (S111), and proceeds to the startup signal determination S110 again. When the power supply control instruction signal s12 is at High level, the startup signal determination unit 5 sets the power supply unit control signal s3 and the battery cell monitoring control unit control signal s4 at Low level (S126). Thereby, the communication unit 10 and the battery cell monitoring control unit 11 stop. Thereafter, the startup signal determination unit 5 changes the data pattern for startup determination (S129), and proceeds to the startup signal determination S110 again. The startup signal determination unit 5 can previously store a plurality of data patterns, and change them in a predefined order. In this way, when the High-level power supply control instruction signal s12 is input from the communication unit 10, the communication unit 10 and the battery cell monitoring control unit 11 are stopped.

The condition to output the High-level power supply control instruction signal s12 is not limited to time or communication quality, and may be a charging state of the battery cells 12, 13, and 14, or a situation of the power supply control device 40. The condition to output the High-level power supply control instruction signal s12 may be instructed from the master controller 15 to the power supply control device 40 by the data pattern of the wireless startup signal s0 or the wireless communication signal s1.

As described above, the structure of the power supply control system according to the present exemplary embodiment is applied thereby to perform startup/stop control by wireless signals and battery cell monitoring control at the same time.

Startup/stop control can be stably performed irrespective of battery cell monitoring control contents, execution time, execution cycle, or the like.

The communication unit controls the startup signal determination unit thereby to efficiently consume power of the power supply control device depending on a communication environment, a situation of the battery cells, or a situation of the power supply control device.

The wireless startup signal or the wireless communication signal includes the ID of the power supply control device, thereby performing startup/stop control and battery cell monitoring control on any power supply control device.

A determination threshold of the startup signal is assumed at the predetermined number of times of reception or the number of times of reception within a predetermined period of time, thereby preventing erroneous startup or erroneous stop.

The wireless startup signal and the wireless communication signal are separated by a circulator or in a modulation system, thereby performing startup/stop control by wireless signals and battery cell monitoring control at the same time even by one shared antenna.

Further, the present exemplary embodiment may be accomplished in combination with the first exemplary embodiment, the second exemplary embodiment, or the third exemplary embodiment.

INDUSTRIAL APPLICABILITY

The present invention is applicable to power supply control systems using a device including batteries and the like.

The present invention is not limited to the above exemplary embodiments, and may encompass various variants. For example, the above exemplary embodiments have been described in detail for easy understanding of the present invention, and the present invention is not necessarily limited to ones including all the components described above. Part of the components of an exemplary embodiment may be replaced with the components of other exemplary embodiment, and the components of an exemplary embodiment may be added with the components of other exemplary embodiment. Part of the components of each exemplary embodiment may be added with other components, deleted, or replaced therewith.

Part or all of components, functions, processing units, processing means, and the like described above may be realized in hardware, for example, designed in an integrated circuit. Further, each component, function, or the like may be realized in software by a processor for interpreting and executing a program for realizing the respective functions. Information on program, table and file for realizing each function may be stored in a recording device such as memory, hard disk or SSD (Solid State Drive) or in a recording medium such as IC card, SD card, or DVD.

The control lines and the information lines, which may be required for explanation, are illustrated, and all of the control lines and the information lines are not necessarily illustrated for products. Almost all the components may be actually connected.

REFERENCE SIGNS LIST 1, 38, 39, 40: Power supply control device
2, 3, 16, 17, 33, 35: Antenna
4: Wireless signal detection unit
5: Startup signal determination unit
6, 24, 26: Power supply unit
7, 8, 9, 25: Power supply circuit
10, 20: Communication unit
11: Battery cell monitoring control unit
12, 13, 14: Battery cell
15: Master controller
18: Startup signal transmission unit
19: Control unit
21: Comparator
22: Amplifier 23: Logic circuit
27, 29: Switch
28, 30: Regulator
31: Control signal combination unit
32: Rectification circuit
34, 36: Signal separation unit
37: Startup unit
s0: Wireless startup signal
s1: Wireless communication signal
s2, s3, s7, s8, s13: Power supply unit control signal
s4, s9: Battery cell monitoring control unit control signal
s5: Monitoring control instruction signal
s6: Monitoring control result signal
s10: Wireless stop signal
s11: Delivery confirmation signal
s12: Power supply control instruction signal
D1, D2: Diode
C1, C2: Capacitor
R1: Resistor

The invention claimed is:

1. A power supply control system comprising:
one or more power supply control devices supplied with power from a battery; and
a controller for wirelessly communicating signals with the power supply control devices,
wherein each of the power supply control devices includes
a startup unit for receiving a wireless startup signal transmitted from the controller, and supplying power from the battery to a communication unit while receiving the wireless startup signal, and
the communication unit for, while being supplied with power from the battery, receiving a monitoring control instruction from the controller, acquiring a monitoring control result for the battery, and transmitting the monitoring control result to the controller as needed in response to the monitoring control instruction,
wherein the startup unit includes
a wireless signal detection unit for detecting a signal intensity of a received wireless signal, and
a startup signal determination unit for determining a data pattern of a received wireless signal,
wherein the startup signal determination unit is supplied with power from the battery while the wireless signal detection unit detects a wireless startup signal with a predetermined signal intensity or more, and
the communication unit is supplied with power from the battery while the startup signal determination unit determines that the data pattern of a wireless signal matches with a predetermined data pattern.

2. The power supply control system according to claim 1, further comprising:
a monitoring control unit supplied with power from the battery while receiving the wireless startup signal or while the communication unit is operating, and directed for monitoring and/or controlling the battery in response to the monitoring control instruction received from the controller to the communication unit, and outputting the monitoring control result to the communication unit.

3. The power supply control system according to claim 1,
wherein the wireless signal detection unit is supplied with power from a different power source from the battery cell, or
the wireless signal detection unit is supplied with power obtained by rectifying the wireless startup signal.

4. The power supply control system according to claim 1,
wherein the communication unit keeps being supplied with power from the battery while operating as instructed in response to the monitoring control instruction from the controller.

5. The power supply control system according to claim 1,
wherein the controller receives the monitoring control result from the power supply control device, and then transmits a wireless stop signal, and
when receiving the wireless stop signal from the controller, the communication unit transmits a delivery confirmation signal to the controller and the controller stops power supplying from the battery.

6. The power supply control system according to claim 1,
wherein, when wireless communication with the controller is interrupted for a predetermined period of time, the controller stops power supplying from the battery to the communication unit.

7. The power supply control system according to claim 6,
wherein after the communication unit starts to operate while the startup unit is detecting a wireless startup signal, the communication unit receives a monitoring control instruction signal from the controller, and transmits a monitoring control result signal to the controller, and when not being able to receive a monitoring control instruction signal again within a predetermined period of time, the communication unit outputs a power supply control instruction signal, and causes the startup unit to stop power supplying to the communication unit and monitoring control on the battery, and
after a predetermined period of time elapses since reception of the power supply control instruction signal, the startup unit returns to the wireless startup signal determination operation.

8. The power supply control system according to claim 1,
wherein when wireless communication with the controller has predetermined communication quality or less, or a predetermined failure probability or more, the controller stops power supplying from the battery to the communication unit.

9. The power supply control system according to claim 8,
wherein when communication quality lowers below a predetermined threshold, the communication unit outputs a power supply control instruction signal, and causes the startup unit to stop power supplying to the communication unit and monitoring control on the battery, and
after a predetermined period of time elapses since reception of the power supply control instruction signal, the startup unit changes the data pattern used for startup determination to a different data pattern.

10. The power supply control system according to claim 9,
wherein when not being able to receive a monitoring control result for a predetermined period of time or receiving an instruction of changing a data pattern from other device, the controller transmits a wireless startup signal including a different data pattern.

11. The power supply control system according to claim 1,
wherein the communication unit records a received monitoring control instruction in a memory, and performs monitoring control based on the recorded monitoring control instruction at a predetermined timing or a timing instructed by the monitoring control instruction, and/or records a monitoring control result in the memory, and transmits the monitoring control result to the controller at a predetermined timing or a timing instructed by the monitoring control instruction.

12. The power supply control system according to claim 1,
wherein when the power supply control devices are present, any one or some of a wireless startup signal, a monitoring control instruction, and a monitoring control result are common in all the power supply control devices, a predetermined data pattern is common in some of the power supply control devices, or a predetermined data pattern is individual to each of the power supply control devices.

13. A power supply control device comprising:
a battery;
a communication unit; and
a startup unit for receiving a wireless startup signal transmitted from an external controller, and supplying power from the battery to the communication unit while receiving the wireless startup signal; and
the communication unit for, while being supplied with power from the battery, receiving a monitoring control instruction from the external controller, acquiring a monitoring control result for the battery, and transmitting the monitoring control result to the external controller as needed in response to the monitoring control instruction,
wherein the startup unit includes
a wireless signal detection unit for detecting a signal intensity of a received wireless signal, and
a startup signal determination unit for determining a data pattern of a received wireless signal,
wherein the startup signal determination unit is supplied with power from the battery while the wireless signal detection unit detects a wireless startup signal with a predetermined signal intensity or more, and
the communication unit is supplied with power from the battery while the startup signal determination unit determines that the data pattern of a wireless signal matches with a predetermined data pattern.

14. A power supply control method in a power supply control system,
wherein the power supply control system includes
one or more power supply control devices supplied with power from a battery, and a controller for wirelessly communicating signals with the power supply control devices, the method comprising:
receiving, by each of the power supply control devices, a wireless startup signal transmitted from the controller,
supplying power from the battery to a communication unit while receiving the wireless startup signal, and
while being supplied with power from the battery, receiving, by the communication unit, a monitoring control instruction from the controller, acquiring a monitoring control result for the battery, and transmitting a monitoring control result to the controller as needed in response to the monitoring control instruction,
detecting a signal intensity of the received wireless startup signal, and
determining, by a startup signal determination unit, a data pattern of the received wireless startup signal,
wherein the startup signal determination unit is supplied with power from the battery while the wireless signal detection unit detects a wireless startup signal with a predetermined signal intensity or more, and
wherein the communication unit is supplied with power from the battery while the startup signal determination unit determines that the data pattern of the received wireless startup signal matches with a predetermined data pattern.

* * * * *